United States Patent
Furuta et al.

(10) Patent No.: US 9,124,260 B2
(45) Date of Patent: *Sep. 1, 2015

(54) FLIP-FLOP, SHIFT REGISTER, DISPLAY PANEL, AND DISPLAY DEVICE

(75) Inventors: Shige Furuta, Osaka (JP); Yuhichiroh Murakami, Osaka (JP); Makoto Yokoyama, Osaka (JP); Seijirou Gyouten, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 19 days.

This patent is subject to a terminal disclaimer.

(21) Appl. No.: 14/124,018
(22) PCT Filed: Jun. 25, 2012
(86) PCT No.: PCT/JP2012/066193
§ 371 (c)(1),
(2), (4) Date: Dec. 5, 2013
(87) PCT Pub. No.: WO2013/002190
PCT Pub. Date: Jan. 3, 2013

(65) Prior Publication Data
US 2014/0098016 A1  Apr. 10, 2014

(30) Foreign Application Priority Data
Jun. 30, 2011  (JP) .................................. 2011-146534

(51) Int. Cl.
G09G 3/36  (2006.01)
H03K 3/356  (2006.01)

(52) U.S. Cl.
CPC ........ *H03K 3/356104* (2013.01); *G09G 3/3648* (2013.01)

(58) Field of Classification Search
CPC . G06F 17/50; G06F 2217/04; G06F 2217/78; G06F 17/5045; G06F 19/3418; G06F 2217/74; G06F 17/5036; G06F 17/505; G06F 1/32; G06F 2217/70; G06F 2217/80; G09G 2320/0276; G09G 2330/02; G09G 2330/021; G09G 3/3648; G09G 3/3688; G09G 2320/043; G09G 2330/028; G09G 2330/04; G09G 3/3225; G09G 2300/043; G09G 2300/0861; G09G 3/3233; G09G 3/3241; G09G 3/3258; H03K 19/0016; H03K 19/00369; H03K 5/2481; H03K 19/215; H03K 21/38; H03K 23/54; H03K 23/544; H03K 23/546; H03K 3/356104

USPC ...................... 345/87, 98–100, 204, 211, 690
See application file for complete search history.

(56) References Cited

U.S. PATENT DOCUMENTS

| 5,812,002 A | 9/1998 | Yoshida | |
|---|---|---|---|
| 7,852,199 B2* | 12/2010 | Desai et al. | 340/426.1 |
| 2012/0092323 A1* | 4/2012 | Murakami et al. | 345/211 |

FOREIGN PATENT DOCUMENTS

| EP | 0 926 825 A2 | 6/1999 |
|---|---|---|
| JP | 9-8612 A | 1/1997 |
| JP | 11-243326 A | 9/1999 |
| WO | 2010/146756 A1 | 12/2010 |

OTHER PUBLICATIONS

Official Communication issued in International Patent Application No. PCT/JP2012/066193, mailed on Jul. 17, 2012.

* cited by examiner

*Primary Examiner* — Duc Dinh
(74) *Attorney, Agent, or Firm* — Keating & Bennett, LLP

(57) ABSTRACT

A flip-flop circuit (11a) includes: an input transistor (Tr19) having a gate terminal thereof connected to an SB terminal, a source terminal thereof connected to an RB terminal, and a drain terminal thereof connected to a first CMOS circuit and a second CMOS circuit; a power supply (VSS) which is connected to the first CMOS circuit or the second CMOS circuit and, when an SB signal is turned to be active, is connected to the RB terminal; and a regulator circuit (RC). With the arrangement, a compact flip-flop and a compact shift register employing the flip-flop are provided, without causing malfunction of the flip-flop and the shift register.

15 Claims, 20 Drawing Sheets

FLIP-FLOP, SHIFT REGISTER, DISPLAY PANEL, AND DISPLAY DEVICE

TECHNICAL FIELD

The present invention relates to a flip-flop and various shift registers.

BACKGROUND ART

Recent years have witnessed a demand for a compact display drive circuit for driving a liquid crystal panel, in order to reduce a frame width of a liquid crystal display device. The size of a display drive circuit has a significant influence on the number of elements of a transistor constituting the circuit. It is therefore important to reduce the number of transistors.

(a) of FIG. 20 is a circuit diagram illustrating an arrangement of a flip-flop used as various display drive circuits of a conventional liquid crystal display device. A flip-flop 100a illustrated in (a) of FIG. 20 includes (i) a P channel transistor p22 and an N channel transistor n21 which constitute a CMOS circuit, (ii) a P channel transistor p23 and an N channel transistor n22 which constitute another CMOS circuit, (iii) a P channel transistor p21, (iv) an SB terminal, (v) an RB terminal, (vi) an INIT terminal, (vii) a Q terminal, and (ix) a QB terminal.

A gate terminal of the transistor p22, a gate terminal of the transistor n21, a drain terminal of the transistor p23, a drain terminal of transistor n22, a drain terminal of transistor p21, and the Q terminal are connected to each other. A drain terminal of the transistor p22, a drain terminal of the transistor n21, a gate terminal of the transistor p23, a gate terminal of the transistor n22, and the QB terminal are connected to each other. The SB terminal is connected to a gate terminal of the transistor p21. The RB terminal is connected to a source terminal of the transistor p21 and a source terminal of the transistor p23. The INIT terminal is connected to a source terminal of the transistor n21. A source terminal of the transistor n22 is connected to a VSS. The transistors p22, n21, p23, and n22 constitute a latch circuit LC, and the transistor p21 serves as a set transistor ST.

(b) of FIG. 20 is a timing chart showing an operation of the flip-flop 100a (in a case where an INIT signal is inactive), and (c) of FIG. 20 is a truth table of the flip-flop 100a (in the case where the INIT signal is inactive). A Q signal of the flip-flop 100a is such that (i) it is at a low level (inactive) during a time period in which an SB signal is at a low level (active) and an RB signal is at a low level (active), (ii) it is at a high level (active) during a time period in which the SB signal is at a low level (active) and the RB signal is at a high level (inactive), (iii) it is at a low level (inactive) during a time period in which the SB signal is at a high level (inactive) and the RB signal is at a low level (active), and (iv) it is in a retention state during a time period in which the SB signal is at a high level (inactive) and the RB signal is at a high level (inactive) (see (b) and (c) of FIG. 20).

For example, during a time period t1 shown in (b) of FIG. 20, the Q terminal receives Vdd (high level) from the RB terminal. Accordingly, the transistor n21 is turned on, so that the QB terminal receives Vss (low level). Then, during a time period t2, the SB signal is turned to a high level, so that the transistor p21 is turned off. Accordingly, the state of the time period t1 is maintained. During a time period t3, the RB signal is turned to a low level. Accordingly, the Q terminal temporarily receives Vss+Vth (a threshold voltage of the transistor p23) via the transistor p23. This turns on the transistor p22, so that the QB terminal receives Vdd (high level). Further, since the QB terminal receives Vdd, the transistor n22 is turned on. Accordingly, the Q terminal receives Vss. Note that in a case where both the SB signal and the RB signal are turned to a low level (active), the Q terminal temporarily receives Vss+Vth via the transistor p21. This turns on the transistor p22, so that the QB terminal receives Vdd (high level). Further, since the QB terminal receives Vdd, the transistor n22 is turned on. Accordingly, the Q terminal receives Vss.

As described above, the flip-flop 100a has an arrangement in which (i) the transistors p22, n21, p23, and n22 (two CMOS circuits) constitute a latch circuit, (ii) the RB terminal is connected to (a) the source terminal of the transistor p21 which serves as a set transistor ST and (b) the source terminal of the transistor p23, and (iii) the source terminal of the transistor n21 is connected to the INIT terminal. With the arrangement, it is possible to carry out a setting operation, a latching operation, a resetting operation, priority determination (when the SB signal and the RB signal are turned to be active simultaneously), and initialization. As described above, when the SB signal and the RB signal of the flip-flop 100a are turned to be active simultaneously, the RB signal (reset) has priority so that the Q signal and the QB signal are turned to be inactive.

(a) of FIG. 21 is a circuit diagram illustrating an arrangement of a flip-flop 100b which is a modified example of (a) of FIG. 20. The flip-flop 100b illustrated in (a) of FIG. 21 includes (i) a P channel transistor p24 and an N channel transistor n24 which constitute a CMOS circuit, (ii) a P channel transistor p25 and an N channel transistor n25 which constitute another CMOS circuit, (iii) an N channel transistor n23, (iv) an S terminal, (v) an R terminal, (vi) an INITB terminal, (vii) a Q terminal, and (viii) a QB terminal.

A gate terminal of the transistor p24, a gate terminal of the transistor n24, a drain terminal of the transistor p25, a drain terminal of transistor n25, a drain terminal of transistor n23, and the QB terminal are connected to each other. A drain terminal of the transistor p24, a drain terminal of the transistor n24, a gate terminal of the transistor p25, a gate terminal of the transistor n25, and the Q terminal are connected to each other. The S terminal is connected to a gate terminal of the transistor n23. The R terminal is connected to a source terminal of the transistor n23 and a source terminal of the transistor n25. The INITB terminal is connected to a source terminal of the transistor p24. A source terminal of the transistor p25 is connected to a VDD. A source terminal of the transistor n24 is connected to a VSS. Here, the transistors p24, n24, p25, and n25 constitute a latch circuit LC, and the transistor n23 serves as a set transistor ST.

(b) of FIG. 21 is a timing chart showing an operation of the flip-flop 100b (in a case where an INITB signal is inactive), and (c) of FIG. 21 is a truth table of the flip-flop 100b (in the case where the INITB signal is inactive). A Q signal of the flip-flop 100a is such that (i) it is in a retention state during a time period in which an S signal is at a low level (inactive) and an R signal is at a low level (inactive), (ii) it is at a low level (inactive) during a time period in which the S signal is at a low level (inactive) and the R signal is at a high level (active), (iii) it is at a high level (active) during a time period in which the S signal is at a high level (active) and the R signal is at a low level (inactive), and (iv) it is at a low level (inactive) during a time period in which the S signal is at a high level (active) and the R signal is at a high level (active) (see (b) and (c) of FIG. 21).

CITATION LIST

[Patent Literature]

Patent Literature 1
International Publication No. WO2010/146756 [Publication Date: Dec. 23, 2010]

SUMMARY OF INVENTION

Technical Problem

The conventional flip-flop described above has a small number of transistors. Although this allows a display drive circuit employing the flip-flop to have a reduced area, the flip-flop may have malfunction in cases where, for example, (i) an input signal (SB terminal) has an electric potential lower than a predetermined level or (ii) the set transistor ST has a low driving capability.

For example, the flip-flop operates in the following manner in a case where the SB signal is active (low level) and the RB signal is inactive (high level) (time period t1). In a case where the Q signal is at a low level and the QB signal is at a high level, the transistor p22 is in an on state. Under the circumstances, when the SB signal is turned to be active (low level), the VSS connected to the source terminal of the transistor n22 and the RB terminal connected to the source terminal of the transistor p21 are short circuited. At this time, in cases where (i) the electric potential (low level) of the SB signal is higher than Vss or (ii) the transistor p21 serving as the set transistor ST has a driving capability lower than that of the transistor n22, an electric potential at the Q terminal is not increased enough to be substantially equal to Vdd. This prevents the transistor n21 from being normally turned on, and thus prevents the Q terminal and the QB terminal from having an electric potential Vdd and an electric potential Vss, respectively. This causes malfunction.

An object of the present invention is to provide a compact flip-flop and a compact resister employing the flip-flop, without causing malfunction of the flip-flop and the shift register.

Solution to Problem

In order to achieve the object, a flip-flop of the present invention includes: a first CMOS circuit; a second CMOS circuit; a plurality of input terminals; a first output terminal; a second output terminal; an input transistor; a power supply; and a regulator circuit, wherein the first CMOS circuit includes a first transistor which is a P channel transistor and a second transistor which is an N channel transistor, the first transistor having a gate terminal and a drain terminal thereof connected to a gate terminal and a drain of the second transistor, respectively, the second CMOS circuit includes a third transistor which is a P channel transistor and a fourth transistor which is an N channel transistor, the third transistor having a gate terminal and a drain terminal thereof connected to a gate terminal and a drain terminal of the fourth transistor, respectively, a gate side of the first CMOS circuit, a drain side of the second CMOS circuit, and the first output terminal are connected to each other, a drain side of the first CMOS circuit, a gate side of the second CMOS circuit, and the second output terminal are connected to each other, the input transistor has a gate terminal, a source terminal, and a drain terminal thereof connected to (i) a first input terminal, (ii) a second input terminal, and (iii) each of the first CMOS circuit and the second CMOS circuit, respectively, the power supply (i) is connected to the first CMOS circuit or the second CMOS circuit and (iii), when a first input signal supplied to the first input terminal is turned to be active, is electrically connected to the second input terminal, the regulator circuit regulates an electric potential between the second input terminal and the power supply when the second input terminal and the power supply are electrically connected to each other.

The flip-flop of the present invention includes the regulator circuit which regulates the electric potential between the second input terminal and the power supply when the second input terminal and the power supply are electrically connected to each other. It is therefore possible to reduce a driving capability of a transistor on a power supply side by providing, for example, a resistor as the regulator circuit (see FIG. 1 etc.). Accordingly, an electric potential of an output terminal connected to the second input terminal becomes substantially equal to an electric potential of an input signal supplied to the second input terminal. This allows the flip-flop to operate properly. The arrangement described above also makes it possible to provide a compact flip-flop and a compact shift register employing the flip-flop.

Advantageous Effects of Invention

As described above, the flip-flop of the present invention includes the regulator circuit which regulates the electric potential between the second input terminal and the power supply when the second input terminal and the power supply are electrically connected to each other. This arrangement makes it possible to provide a compact flip-flop and a compact shift resister employing the flip-flop, without causing malfunction of the flip-flop and the shift register.

BRIEF DESCRIPTION OF DRAWINGS (a) of FIG. 1 is a circuit diagram illustrating an arrangement of a flip-flop circuit in accordance with Embodiment 1. (b) of FIG. 1 is a timing chart showing an operation of the flip-flop circuit (in a case where an INIT signal is inactive). (c) of FIG. 1 is a truth table of the flip-flop circuit (in the case where the INIT signal is inactive).

(a) of FIG. 2 is a circuit diagram illustrating an arrangement of a flip-flop circuit, which is a modified example of (a) of FIG. 1. (b) of FIG. 2 is a timing chart showing an S signal, an R signal, and a Q signal of the flip-flop circuit. (c) of FIG. 2 is a truth table of the flip-flop circuit (in a case where an INITB signal is inactive).

(a) of FIG. 3 is a circuit diagram illustrating an arrangement of a flip-flop circuit in accordance with Embodiment 2. (b) of FIG. 3 is a timing chart showing an operation of the flip-flop circuit (in a case where an INITB signal is inactive). (c) of FIG. 3 is a truth table of the flip-flop circuit (in the case where the INITB signal is inactive).

(a) of FIG. 4 is a circuit diagram illustrating an arrangement of a flip-flop circuit, which is a modified example of (a) of FIG. 3. (b) of FIG. 4 is a timing chart showing an operation of the flip-flop circuit (in a case where an INITB signal is inactive). (c) of FIG. 4 is a truth table of the flip-flop circuit (in the case where the INITB signal is inactive).

(a) of FIG. 5 is a circuit diagram illustrating an arrangement of a flip-flop circuit in accordance with Embodiment 3. (b) of FIG. 5 is a timing chart showing an S signal, an R signal, and a Q signal of the flip-flop circuit. (c) of FIG. 3 is a truth table of the flip-flop circuit (in a case where an INITB signal is inactive).

(a) and (b) of FIG. 6 are each a circuit diagram illustrating a modified example of the flip-flop circuit illustrated in FIG. 5.

FIG. 7 is a circuit diagram illustrating a modified example of the flip-flop circuit illustrated in FIG. 5.

(a) of FIG. 8 is a circuit diagram illustrating an arrangement of a flip-flop circuit, which is a modified example of (a) of FIG. 5. (b) of FIG. 8 is a timing chart showing an SB signal, an RB signal, and a Q signal of the flip-flop circuit. (c) of FIG. 8 is a truth table of the flip-flop circuit (in a case where an INIT signal is inactive).

(a) of FIG. 9 is a circuit diagram illustrating an arrangement of a flip-flop circuit in accordance with Embodiment 4. (b) of FIG. 9 is a timing chart showing an S signal, an R signal, and a Q signal of the flip-flop circuit. (c) of FIG. 9 is a truth table of the flip-flop circuit (in a case where an INITB signal is inactive).

(a) of FIG. 10 is a circuit diagram illustrating an arrangement of a flip-flop circuit, which is a modified example of (a) of FIG. 9. (b) of FIG. 10 is a timing chart showing an SB signal, an RB signal, and a Q signal of the flip-flop circuit. (c) of FIG. 10 is a truth table of the flip-flop circuit (in a case where an INIT signal is inactive).

(a) of FIG. 11 is a circuit diagram illustrating an arrangement of a flip-flop circuit in accordance with Embodiment 5 of the present invention. (b) of FIG. 11 is a timing chart showing an S signal, an R signal, and a Q signal of the flip-flop circuit. (c) of FIG. 11 is a truth table of the flip-flop circuit (in a case where an INITB signal is inactive).

(a) of FIG. 12 is a circuit diagram illustrating an arrangement of a flip-flop circuit, which is a modified example of (a) of FIG. 11. (b) of FIG. 12 is a timing chart showing an SB signal, an RB signal, and a Q signal of the flip-flop circuit. (c) of FIG. 12 is a truth table of the flip-flop circuit (in a case where an INIT signal is inactive).

(a) of FIG. 13 is a circuit diagram illustrating an arrangement of a flip-flop circuit in accordance with Embodiment 6. (b) of FIG. 13 is a timing chart showing an S signal, an R signal, and a Q signal of the flip-flop circuit. (c) of FIG. 13 is a truth table of the flip-flop circuit (in a case where an INITB signal is inactive).

(a) of FIG. 14 is a circuit diagram illustrating an arrangement of a flip-flop circuit, which is a modified example of (a) of FIG. 13. (b) of FIG. 14 is a timing chart showing an SB signal, an RB signal, and a Q signal of the flip-flop circuit. (c) of FIG. 14 is a truth table of the flip-flop circuit (in a case where an INIT signal is inactive).

Figure 20:
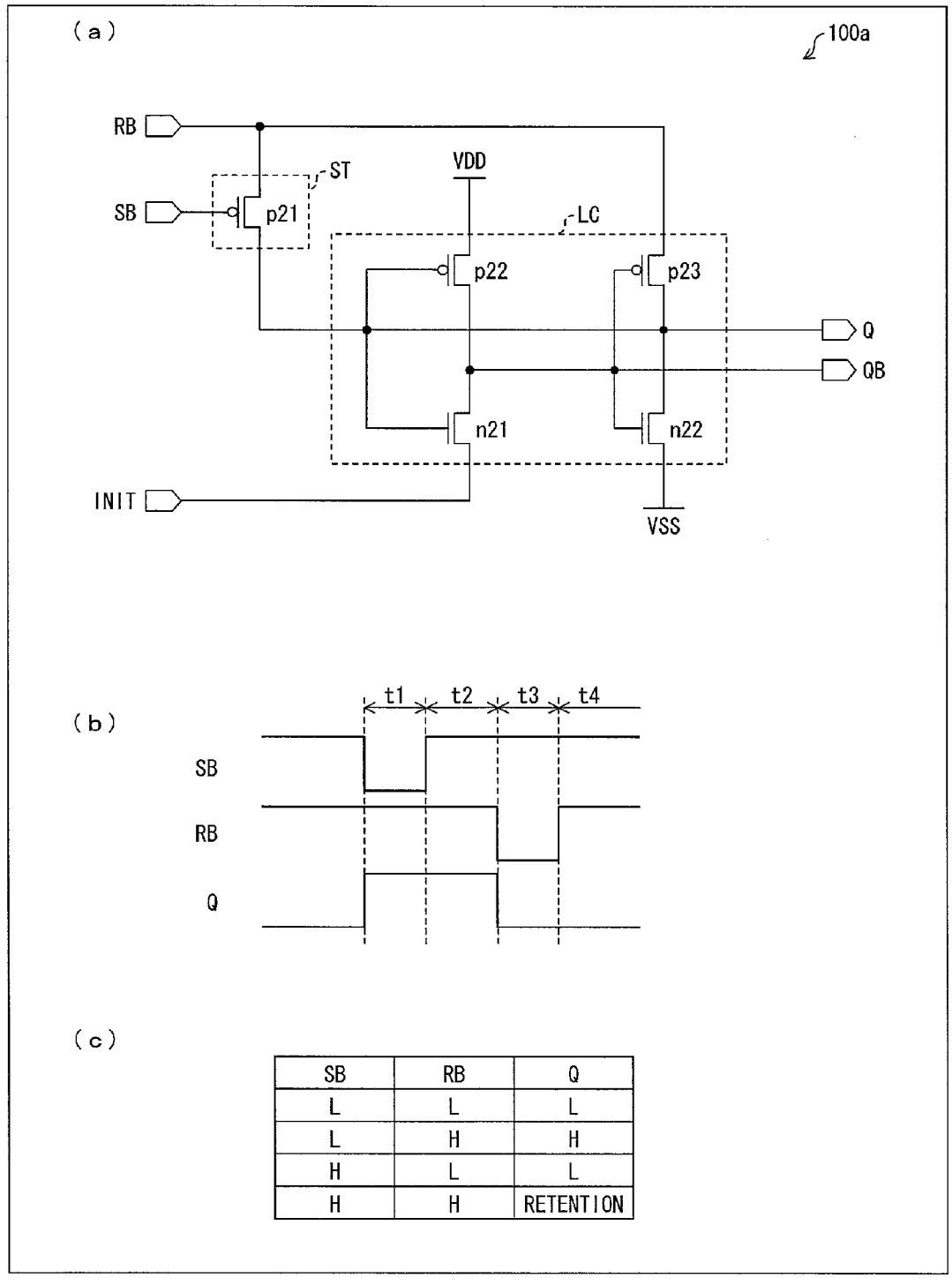

(a) of FIG. 20 is a circuit diagram illustrating an arrangement of a conventional flip-flop circuit. (b) of FIG. 20 is a timing chart showing an operation of the flip-flop circuit (in a case where an INIT signal is inactive). (c) of FIG. 20 is a truth table of the flip-flop circuit (in the case where the INIT signal is inactive).

Figure 21:
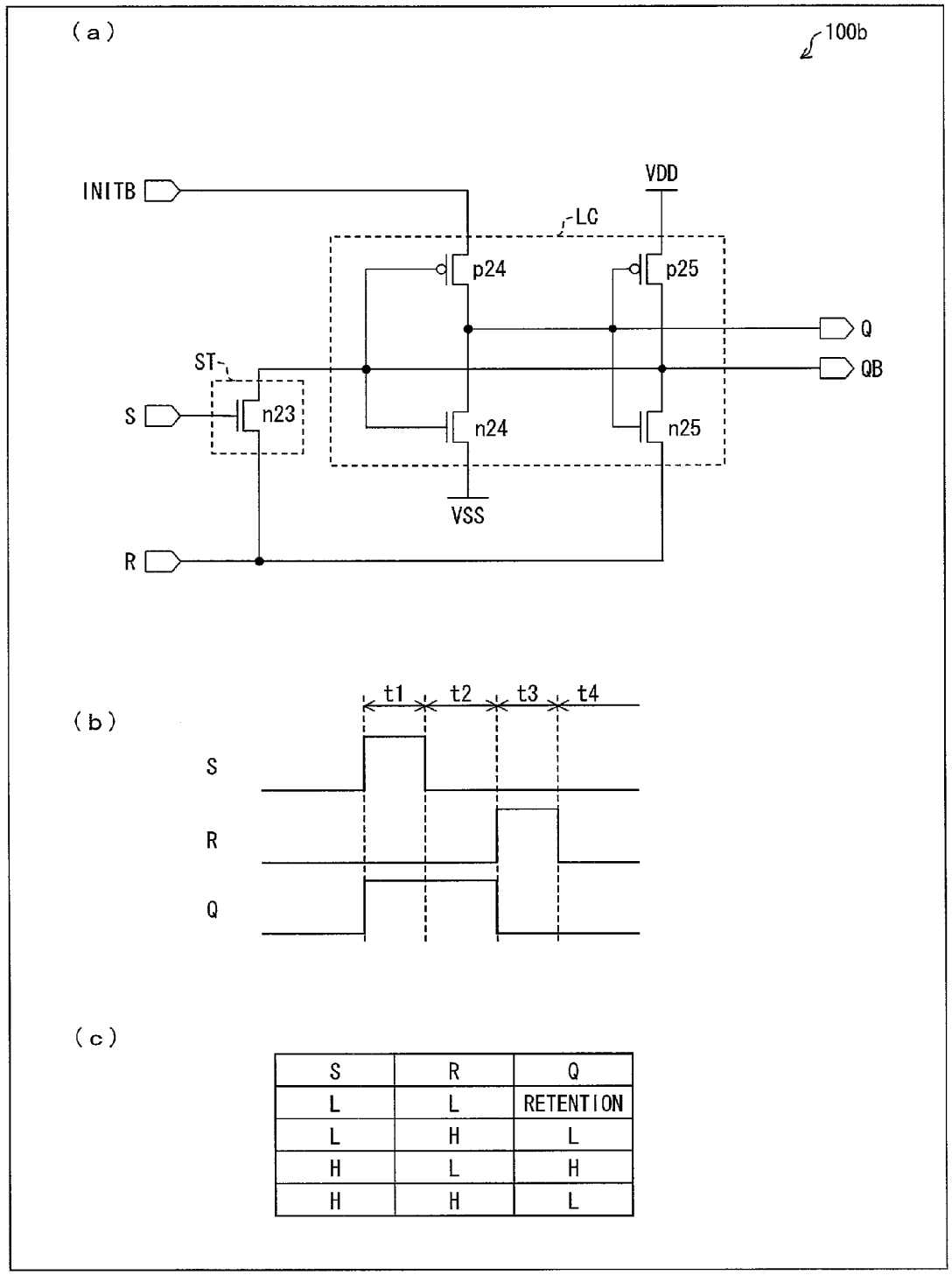

(a) of FIG. 21 is a circuit diagram illustrating an arrangement of a conventional flip-flop circuit. (b) of FIG. 21 is a timing chart showing an operation of the flip-flop circuit (in a case where an INITB signal is inactive). (c) of FIG. 21 is a truth table of the flip-flop circuit (in the case where the INITB signal is inactive).

DESCRIPTION OF EMBODIMENTS

The following description will discuss Embodiment 1 of the present invention. Note that, in the following description, a set/reset type flip-flop circuit (flip-flop) receives (i) a set signal (S signal or SB signal) (first input signal) via a set terminal (S terminal or SB terminal) (first input terminal), (ii) a reset signal (R signal or RB signal) (second input signal) via a reset terminal (R terminal or RB terminal) (second input terminal), and (iii) an initialization signal (INIT signal or INITB signal) via an initialization terminal (INIT terminal or INITB terminal) (third input terminal). Further, the set/reset type flip-flop circuit outputs (i) a Q signal via an output terminal (Q terminal: first output terminal) and (ii) a QB signal via an inversion output terminal (QB terminal: second output terminal). Note that an electric potential of a high potential power supply (VDD) is Vdd (hereinafter, referred to as "high level", as appropriate), and an electric potential of a low potential power supply (VSS) is Vss (hereinafter, referred to as "low level", as appropriate). The S signal (set signal), the R signal (reset signal), the INIT signal (initialization signal), and the Q signal (output signal) are at a high level when these are active. The SB signal (set-bar signal), the RB signal (reset-bar signal), the INITB signal (initial-bar signal), and the QB signal (inversion output signal) are at a low level when these are active.

[Flip-Flop Circuit in Accordance with Embodiment 1]

Figure 1:
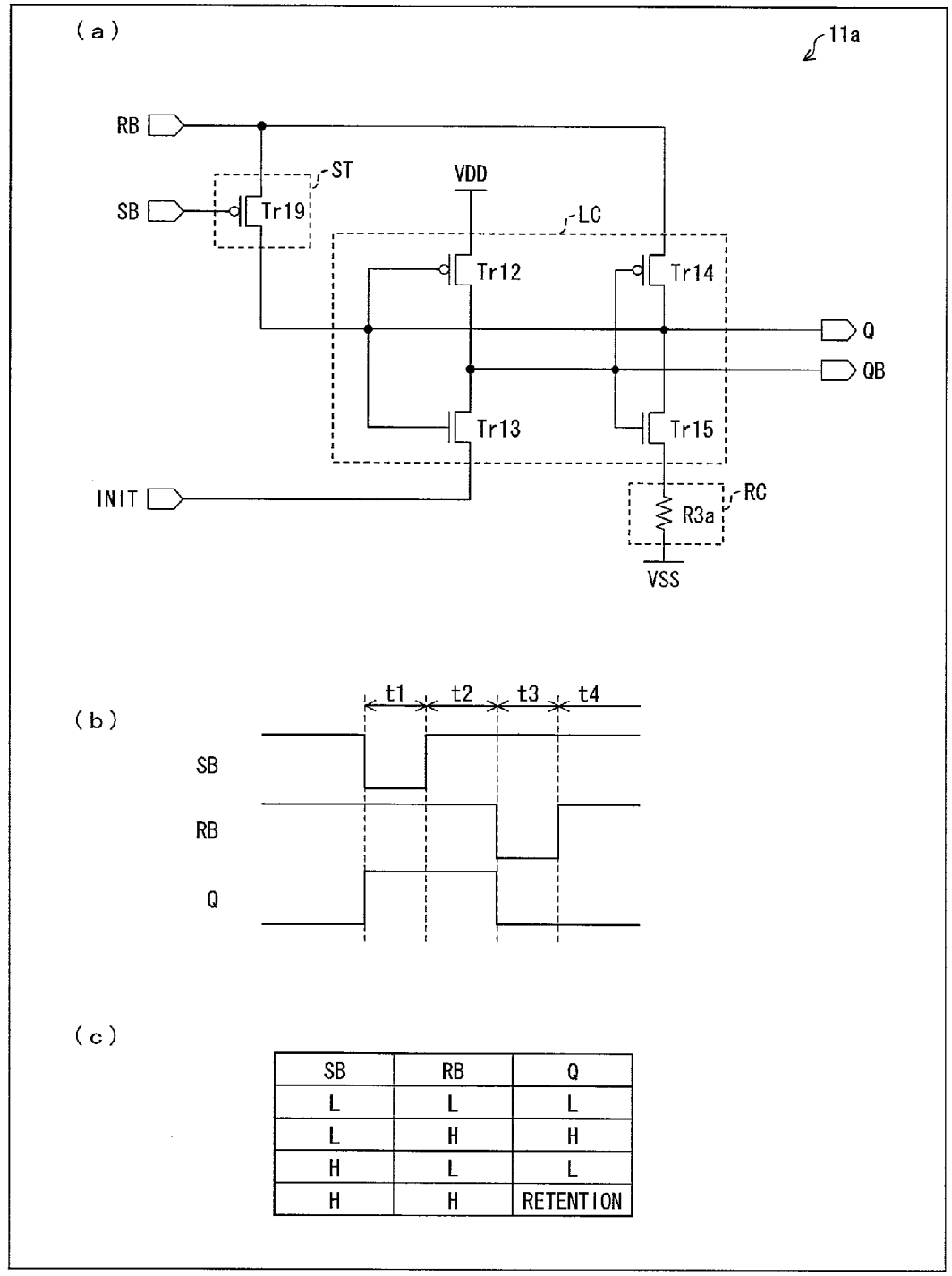

(a) of FIG. 1 is a circuit diagram illustrating an arrangement of a flip-flop circuit in accordance with Embodiment 1. A flip-flop circuit 11a illustrated in (a) of FIG. 1 includes (i) a P channel transistor Tr12 and an N channel transistor Tr13 which constitute a CMOS circuit, (ii) a P channel transistor Tr14 and an N channel transistor Tr15 which constitute another CMOS circuit, (iii) a P channel transistor Tr19, (iv) a resistor R3a, (v) an SB terminal, (vi) an RB terminal, (vii) an INIT terminal, (viii) a Q terminal, and (ix) a QB terminal.

A gate terminal of the transistor Tr12, a gate terminal of the transistor Tr13, a drain terminal of the transistor Tr14, a drain terminal of the transistor Tr15, a drain terminal of the transistor Tr19, and the Q terminal are connected to each other. A drain terminal of the transistor Tr12, a drain terminal of the transistor Tr13, a gate terminal of the transistor Tr14, a gate terminal of the transistor Tr15, and the QB terminal are connected to each other. The SB terminal is connected to a gate terminal of the transistor Tr19. The RB terminal is connected to a source terminal of the transistor Tr19 and a source terminal of the transistor Tr14. The INIT terminal is connected to a source terminal of the transistor Tr13. One end of the resistor R3a is connected to a source terminal of the transistor Tr15, and the other end of the resistor R3a is connected to a power supply VSS. A source terminal of the transistor Tr12 is connected to a power supply VDD.

The transistors Tr12, Tr13, Tr14, and Tr15 constitute a latch circuit LC. The resistor R3a constitutes a latch regulator circuit RC (regulator circuit). A transistor Tr16 serves as a set transistor ST. In the following descriptions, a voltage (signal level) that turns on a transistor when applied to the transistor via a gate terminal (control terminal) is referred to as "ON voltage (ON level)", and a voltage (signal level) that turns on the transistor when applied to the transistor via the gate terminal is referred to as "OFF voltage (OFF level)." For an N channel transistor, a high voltage serves as the ON voltage (a high level is the ON level) and a low voltage serves as the OFF voltage (a low level is the OFF level), and for a P channel transistor, this relation is reversed.

(b) of FIG. 1 is a timing chart showing an operation of the flip-flop circuit 11a (in a case where the INIT signal is inactive), and (c) of FIG. 1 is a truth table of the flip-flop circuit 11a (in the case where the INIT signal is inactive).

The following description deals with an operation of the flip-flop circuit 11a in a case where the SB signal is active (low level) and the RB signal is inactive (high level) (time period t1).

In a case where the Q signal had been at a low level and the QB signal had been at a high level before the SB signal was turned to be active (low level), the drain terminal of the transistor Tr19 and the power supply VSS are short-circuited. Here, in a case where the SB signal is, for example, higher than Vss, the transistor Tr19, when employed in the conventional arrangement illustrated in FIG. 20, is not reliably turned on. In contrast, the flip-flop circuit 11*a* has an arrangement in which the resistor R3*a* is provided between the drain terminal of the transistor Tr19 and the power supply VSS. This reduces the driving capability of the transistor Tr15, and thus allows an electric potential of the Q terminal to be reduced to a level (an electric potential higher than an inversion level of an inverter) substantially equal to Vdd (high level), even in a case where the S signal is higher than, for example, the power supply voltage Vss.

In a case where the electric potential at the Q terminal is increased to be substantially equal to Vdd, the transistor Tr13 is turned on and the transistor Tr12 is turned off. At this time, since the INIT signal is at a low level (inactive), the QB signal is turned to a low level. The QB terminal is connected to the gate terminal of the transistor Tr14 and the gate terminal of the transistor Tr15. Accordingly, when the QB signal is turned to a low level, the transistor Tr14 is turned on and the transistor Tr15 is turned off. This causes the Q signal to a high level (Vdd).

The following description deals with an operation of the flip-flop circuit 11*a* in a case where the SB signal is inactive (high level) and the RB signal is inactive (high level) (time period t2).

When the SB signal and the RB signal are turned to be inactive (high level), the transistor Tr19 is turned off. Accordingly, a state in which the SB signal was before being changed is retained. That is, the state of the time period t1 (the Q signal is at a high level and the QB signal is at a low level) is retained during the time period t2.

The following description deals with an operation of the flip-flop circuit 11*a* in a case where the SB signal is inactive (high level) and the RB signal is active (low level) (time period t3).

In a case where the Q signal is at a high level and the QB signal is at a low level, the transistor Tr14 is in the on state and, accordingly, the RB terminal is connected to the Q terminal. Under the circumstances, in a case where the RB signal is turned to be active (low level), the transistor Tr14 is turned off when an electric potential at the Q terminal is turned to Vss+Vth (threshold). Here, the electric potential at the Q terminal is not reduced to below VSS+Vth. The Q terminal is connected to the gate terminal of the transistor Tr12 and the gate terminal of the transistor Tr13. Accordingly, when the electric potential at the Q terminal is reduced to be substantially equal to Vss, the transistor Tr12 is turned on and the transistor Tr13 is turned off. In a case where a threshold of the transistor Tr13 is not less than Vth, the transistor Tr13 is completely turned off. When the transistor Tr12 is turned on, the QB terminal and the power supply VDD are electrically connected to each other, so that the electric potential at the QB terminal is turned to Vdd. The QB terminal is connected to the gate terminal of the transistor Tr14 and the gate terminal of the transistor Tr15. Accordingly, when the electric potential at the QB terminal is turned to Vdd, (i) the transistor Tr14 is turned off, so that the Q terminal is disconnected from the RB terminal electrically and (ii) the transistor Tr15 is turned on, so that the Q terminal is electrically connected to the power supply VSS, thereby having an electric potential Vss. When the electric potential at the Q terminal is turned to Vss, the transistor Tr12 is turned on and the transistor Tr13 is turned off. This causes the QB terminal to be connected to the power supply VDD and thus receive Vdd.

As described above, the Q terminal starts being shifted toward Vss+Vth instantaneously, but the output is fed back by the latch circuit LC. This allows the Q terminal to output Vss stably.

The following description deals with an operation of the flip-flop circuit 11*a* in a case where the SB signal is inactive (high level) and the RB signal is inactive (high level) (time period t4).

In the case where the SB signal is inactive (high level) and the RB signal is inactive (high level), the latch circuit LC is turned on. Accordingly, a state in which the RB signal was before being changed is retained, that is, the state of the time period t3 (the Q signal is at a low level and the QB signal is at a high level) is retained during the time period t4.

As described above, the flip-flop circuit 11*a* is arranged such that the resistor R3*a* is provided between (i) the power supply (VSS) which, when the set signal (SB signal) is active, is electrically connected to the input terminal (RB) for receiving the reset signal (RB signal) and (ii) the set transistor ST (transistor Tr19). Accordingly, the electric potential of the Q terminal is increased to be substantially equal to Vdd even in cases where, for example, the electric potential (low level) of the SB signal is higher than Vss or the set transistor ST (transistor Tr19) has a driving capability lower than that of the transistor Tr15. This allows the transistor Tr13 to be turned on normally, so that the electric potential of the Q terminal is turned to Vdd and the electric potential of the QB terminal is turned to Vss. This makes it possible to prevent malfunction that may be caused in the conventional arrangement (FIG. 20).

(Initialization Operation)

The following description deals with an operation of the flip-flop circuit 11*a* in a case where the INIT signal is active (high level) (initialization).

In a case where the Q signal had been at a low level and the QB signal had been at a high level before the INIT signal was turned to be active, the turning of the INIT signal to a high level has no influence on the output of the flip-flop circuit 11*a* (the Q signal is at a low level and the QB signal is at a high level) because the transistor Tr13 has been turned off. In a case where the Q signal had been at a high level and the QB signal had been at a low level before the INIT signal was turned to be active, the turning of the INIT signal to a high level increases the electric potential at the QB terminal to Vdd−Vth (threshold voltage) because the transistor Tr13 has been turned on. When the electric potential at the QB terminal is increased to be substantially equal to Vdd, the transistor Tr15 is turned on and the transistor Tr14 is turned off (in a case where a threshold of the transistor Tr14 is not less than Vth, the transistor Tr14 is completely turned off). In this case, the Q terminal is connected to the power supply VSS electrically, so that the Q signal is turned to a low level (Vss). The Q terminal is connected to the gate terminal of the transistor Tr12 and the gate terminal of the transistor Tr13. Accordingly, when the Q signal is turned to a low level, the transistor Tr13 is turned off and the transistor Tr12 is turned on. Here, when the transistor Tr12 is turned on, the QB terminal is electrically connected to the power supply VDD, so that the QB signal is turned to a high level. In the case where the QB signal is at a high level, the transistor Tr15 is in the on state and the transistor Tr14 is in the off state. Accordingly, the Q terminal is disconnected from the RB terminal electrically, and outputs a low level signal (Vss). As described above, the QB signal starts being shifted toward Vdd−Vth instantaneously, but the Q signal is fed back by the latch circuit LC. Accordingly the QB signal is maintained at a high level (Vdd) stably. With the method described above, it is possible to carry out the initialization.

(Modified Example)

Figure 2:
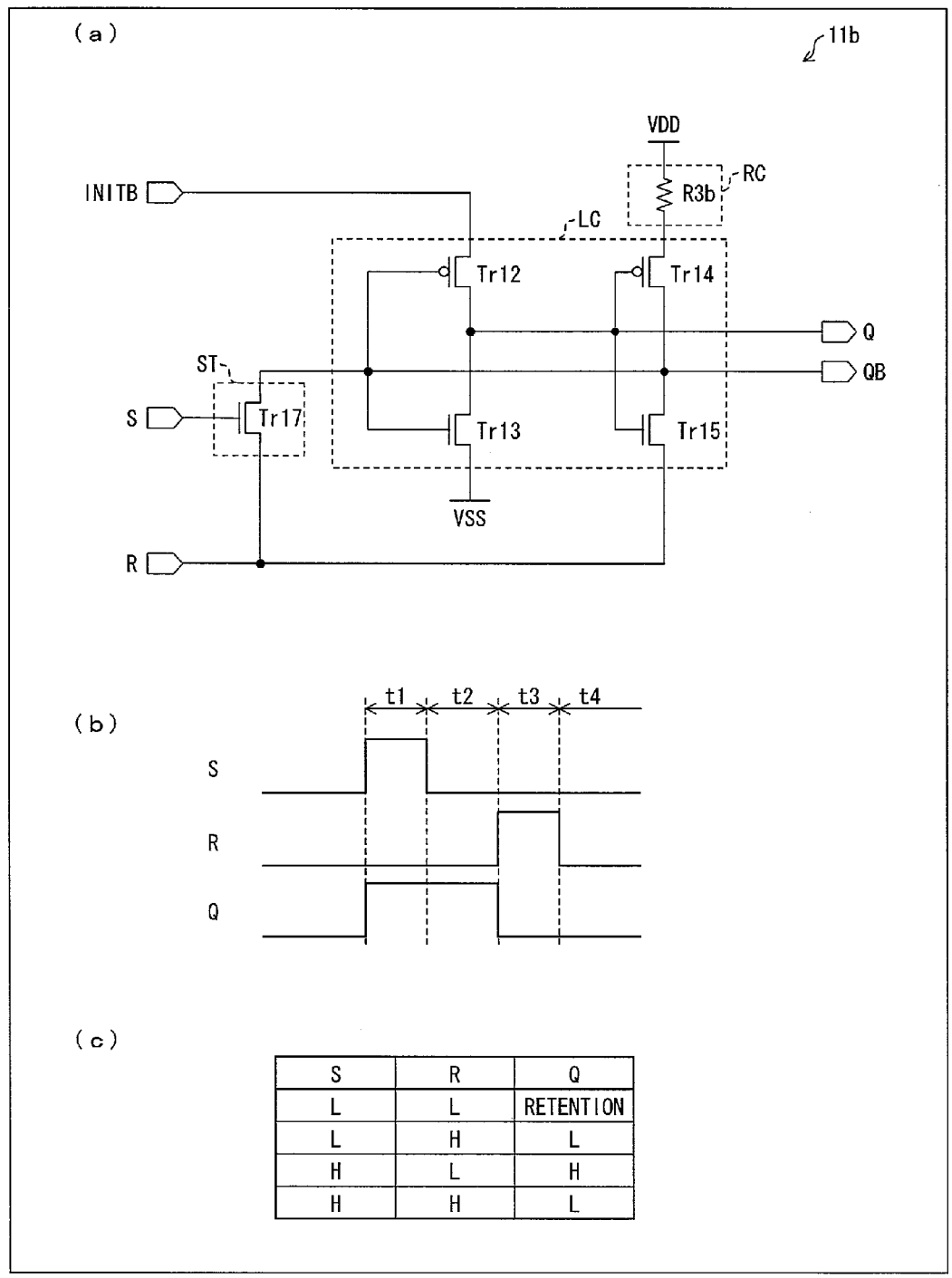

(a) of FIG. 2 is a circuit diagram illustrating an arrangement of a flip-flop circuit 11b, which is a modified example of (a) of FIG. 1.

A flip-flop circuit 11b illustrated in (a) of FIG. 2 includes (i) a P channel transistor Tr12 and an N channel transistor Tr13 which constitute a CMOS circuit, (ii) a P channel transistor Tr14 and an N channel transistor Tr15 which constitute another CMOS circuit, (iii) an N channel transistor Tr17, (iv) a resistor R3b, (v) an S terminal, (vi) an R terminal, (vii) an INITB terminal, (viii) a Q terminal, and (ix) a QB terminal.

A gate terminal of the transistor Tr12, a gate terminal of the transistor Tr13, a drain terminal of the transistor Tr14, a drain terminal of the transistor Tr15, a drain terminal of the transistor Tr17, and the QB terminal are connected to each other. A drain terminal of the transistor Tr12, a drain terminal of the transistor Tr13, a gate terminal of the transistor Tr14, a gate terminal of the transistor Tr15, and the Q terminal are connected to each other. The S terminal is connected to a gate terminal of the transistor Tr17. The R terminal is connected to a source terminal of the transistor Tr17 and a source terminal of the transistor Tr15. The INITB terminal is connected to a source terminal of the transistor Tr12. A source terminal of the transistor Tr14 is connected to one end of the resistor R3a, and a power supply VDD is connected to the other end of the resistor R3a. A source terminal of the transistor Tr13 is connected to a power supply VSS.

The transistors Tr12, Tr13, Tr14, and Tr15 constitute a latch circuit LC. The resistor R3b constitutes a latch regulator circuit RC (regulator circuit). The transistor Tr17 serves as a set transistor ST (input transistor).

(b) of FIG. 2 is a timing chart showing an S signal, an R signal, and a Q signal of the flip-flop circuit 11b, and (c) of FIG. 2 is a truth table of the flip-flop circuit 11b (in a case where the INITB signal is inactive). The Q signal of the flip-flop circuit 11b is such that (i) it is in a retention state during a time period in which the S signal is at a low level (L: inactive) and the R signal is at a low level (L: inactive), (ii) it is at a low level (L: inactive) during a time period in which the S signal is at a low level (L: inactive) and the R signal is at a high level (H: active), (iii) it is at a high level (H: active) during a time period in which the S signal is at a high level (H: active) and the R signal is at a low level (L: inactive), and (iv) it is at a low level (L: inactive) during a time period in which the S signal is at a high level (H: active) and the R signal is at a high level (H: active) (see (c) of FIG. 2).

The flip-flop circuit 11b is arranged such that the resistor R3b is provided between (i) the power supply (VDD) which, when the set signal (S signal) is active, is electrically connected to the input terminal (R) for receiving the reset signal (R signal) and (ii) the set transistor ST (transistor Tr17). Accordingly, the electric potential of the QB terminal is reduced to be substantially equal to Vss even in cases where, for example, the electric potential (high level) of the S signal is higher than Vdd or the set transistor ST (transistor Tr17) has a driving capability lower than that of the transistor Tr14. This allows the transistor Tr12 to be turned on normally, so that the electric potential of the Q terminal is turned to Vdd and the electric potential of the QB terminal is turned to Vss. This makes it possible to prevent malfunction that may be caused in the conventional arrangement (FIG. 21).

[Flip-Flop Circuit in Accordance with Embodiment 2]

Figure 3:
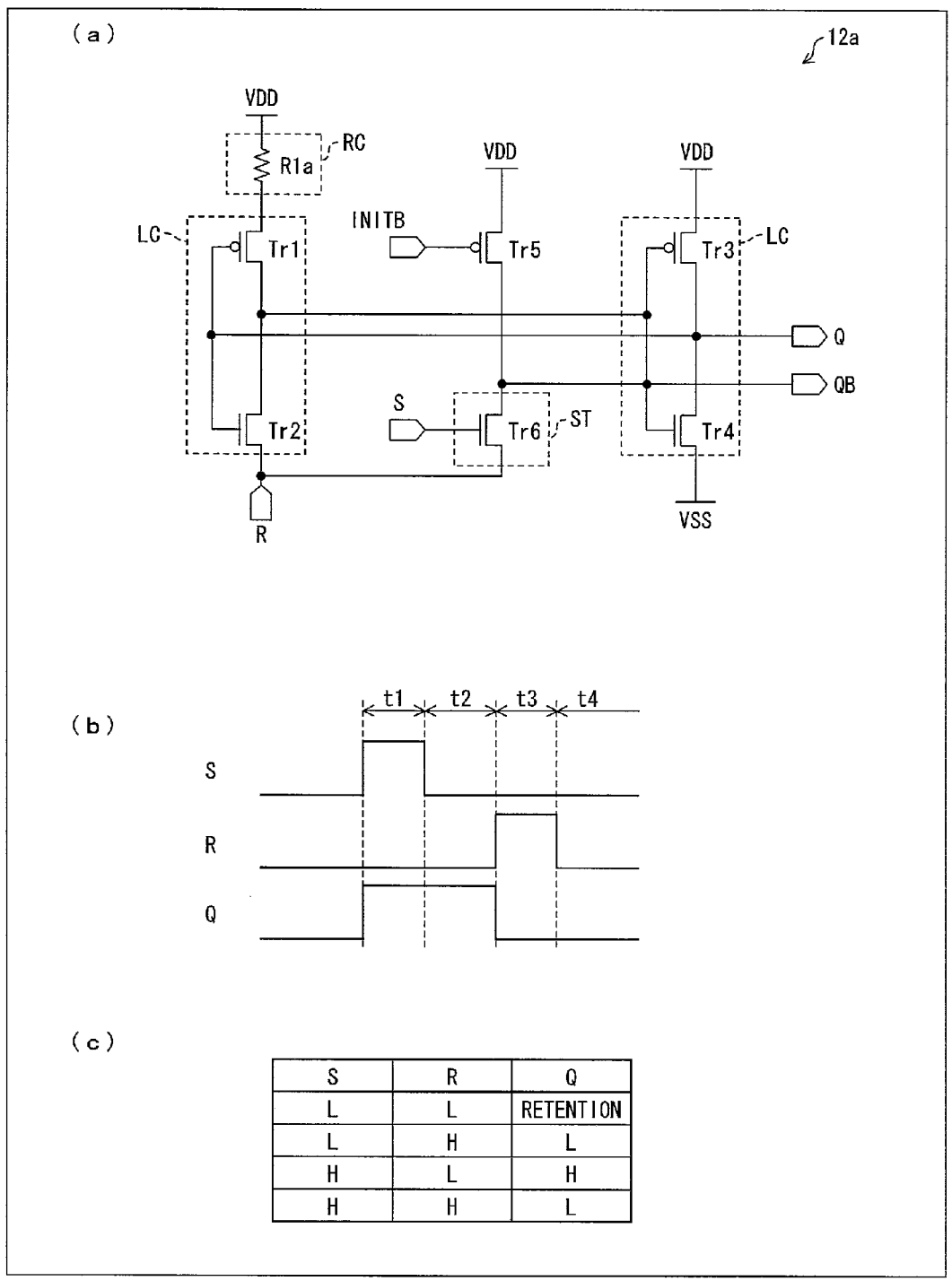

(a) of FIG. 3 is a circuit diagram illustrating an arrangement of a flip-flop circuit in accordance with Embodiment 2.

A flip-flop circuit 12a illustrated in (a) of FIG. 3 includes (i) a P channel transistor Tr1 and an N channel transistor Tr2 which constitute a CMOS circuit (first CMOS circuit), (ii) a P channel transistor Tr3 and an N channel transistor Tr4 which constitute another CMOS circuit (second CMOS circuit), (iii) a P channel transistor Tr5 and an N channel transistor Tr6 which constitute yet another CMOS circuit, (iv) a resistor R1a, (v) an S terminal, (vi) an R terminal, (vii) an INITB terminal, (viii) a Q terminal, and (ix) a QB terminal.

A gate terminal of the transistor Tr1, a gate terminal of the transistor Tr2, a drain terminal of the transistor Tr3, a drain terminal of the transistor Tr4, and the Q terminal are connected to each other. A drain terminal of the transistor Tr1, a drain terminal of the transistor Tr2, a gate terminal of the transistor Tr3, a gate terminal of the transistor Tr4, a drain terminal of the transistor Tr5, a drain terminal of the transistor Tr6, and the QB terminal are connected to each other. The S terminal is connected to a gate terminal of the transistor Tr6. The R terminal is connected to a source terminal of the transistor Tr2 and a source terminal of the transistor Tr6. The INITB terminal is connected to a gate terminal of the transistor Tr5. One end of the resistor R1a is connected to a source terminal of the transistor Tr1, and the other end of the resistor R1a is connected to a power supply VDD. A source terminal of the transistor Tr3 is connected to the power supply VDD. A source terminal of the transistor Tr4 is connected to a power supply VSS. A source terminal of the transistor Tr5 is connected to the power supply VDD. The transistors Tr1, Tr2, Tr3, and Tr4 constitute a latch circuit LC. The resistor R1a constitutes a latch regulator circuit RC (regulator circuit). The transistor Tr6 serves as a set transistor ST (input transistor).

(b) of FIG. 3 is a timing chart showing an operation of the flip-flop circuit 12a (in a case where the INITB signal is inactive), and (c) of FIG. 3 is a truth table of the flip-flop circuit 12a (in the case where the INITB signal is inactive).

The following description deals with an operation of the flip-flop circuit 12a in a case where the SB signal is active (high level) and the R signal is inactive (low level) (time period t1).

In a case where the Q signal had been at a low level and the QB signal had been at a high level before the S signal was turned to be active (high level), the drain terminal of the transistor Tr6 and the power supply VDD are short-circuited. Note, here, that the resistor R1a is provided between the drain terminal of the transistor Tr6 and the power supply VDD, so that the driving capability of the transistor Tr1 is reduced. As such, even in a case where the S signal is lower than, for example, the power supply voltage Vdd, an electric potential of the QB terminal is reduced to a level (an electric potential lower than an inversion level of an inverter) substantially equal to Vss (low level).

In a case where the electric potential at the QB terminal is reduced to be substantially equal to Vss, the transistor Tr3 is turned on and the transistor Tr4 is turned off. At this time, the Q signal is turned to a high level. The Q terminal is connected to the gate terminal of the transistor Tr1 and the gate terminal of the transistor Tr2. Accordingly, when the Q signal is turned to a high level, the transistor Tr1 is turned off and the transistor Tr2 is turned on. Since the R signal is VSS (low level), the QB signal is also turned to a low level (Vss) when the transistor Tr2 is turned on. In a case where the QB signal is at a low level, the transistor Tr3 is in the on state, and the transistor Tr4 is in the off state. In this case, the Q terminal is disconnected from the power supply VSS electrically, and outputs a high level signal (Vdd).

The following description deals with an operation of the flip-flop circuit 12a in a case where the S signal is inactive (low level) and the R signal is inactive (low level) (time period t2).

When the S signal and the R signal are turned to be inactive (low level), the transistor Tr6 is turned off. Accordingly, a state in which the S signal was before being changed is retained. That is, the state of the time period t1 (the Q signal is at a high level and the QB signal is at a low level) is retained during the time period t2.

The following description deals with an operation of the flip-flop circuit 12a in a case where the S signal is inactive (low level) and the R signal is active (high level) (time period t3).

In a case where the Q signal is at a high level and the QB signal is at a low level, the transistor Tr2 is in the on state. Under the circumstances, when the R signal is turned to be active (high level), an electric potential of the QB terminal is increased to a level (an electric potential higher than the inversion level of the inverter) substantially equal to Vdd (high level).

When the electric potential at the QB terminal is increased to be substantially equal to Vdd, the transistor Tr3 is turned off and the transistor Tr4 is turned on. This turns the Q signal to a low level. The Q terminal is connected to the gate terminal of the transistor Tr1 and the gate terminal of the transistor Tr2. Accordingly, when the Q signal is turned to a low level, the transistor Tr1 is turned on and the transistor Tr2 is turned off. When the transistor Tr1 is turned on, the QB signal is turned to a high level (Vdd). In a case where the QB signal is at a high level, the transistor Tr3 is in the off state, and the transistor Tr4 is in the on state. In this case, the Q terminal is disconnected from the power supply VDD electrically, and outputs a low level signal (Vss).

The following description deals with an operation of the flip-flop circuit 12a in a case where the S signal is inactive (low level) and the R signal is inactive (low level) (time period t4). When the S signal is turned to be inactive (low level) and the R signal is turned to be inactive (low level), the latch circuit LC is turned on. Accordingly, a state in which the R signal was before being changed is retained. That is, the state of the time period t3 (the Q signal is at a low level and the QB signal is at a high level) is retained during the time period t4.

As described above, the flip-flop circuit 12a is arranged such that the resistor R1a is provided between (i) the power supply (VDD) which, when the set signal (S signal) is active, is electrically connected to the input terminal (R) for receiving the reset signal (R signal) and (ii) the set transistor ST (transistor Tr6). Accordingly, the electric potential of the QB terminal is increased to be substantially equal to Vss even in cases where, for example, the electric potential (high level) of the S signal is lower than Vdd or the set transistor ST (transistor Tr6) has a driving capability lower than that of the transistor Tr1. This allows the transistor Tr3 to be turned on normally, so that the electric potential of the Q terminal is turned to Vdd and the electric potential of the QB terminal is turned to Vss. This makes it possible to prevent malfunction resulting from an electric potential of an input signal or transistor characteristics.

(Initialization Operation)

The following description deals with an operation of the flip-flop circuit 12a in a case where the INITB signal is active (low level) (initialization) in a state where the S signal and the R signal are inactive (low level).

When the INITB signal is turned to be active (low level) in a case where the Q signal was at a low level and the QB signal was at a high level before the INITB signal is turned to be active, the power supply VDD and the QB terminal are electrically connected to each other. As such, there is no influence on the output of the flip-flop circuit 11a (the Q signal is at a low level and the QB signal is at a high level). When the INITB signal is turned to be active (low level) in a case where the Q signal was at a high level and the QB signal was at a low level before the INITB signal is turned to be active, the electric potential at the QB terminal is increased to Vdd. When the electric potential at the QB terminal is increased to be substantially equal to Vdd, the transistor Tr4 is turned on and the transistor Tr3 is turned off (in a case where a threshold of the transistor Tr3 is not less than Vth, the transistor Tr3 is completely turned off). In this case, the Q terminal is connected to the power supply VSS electrically, so that the Q signal is turned to a low level (Vss). The Q terminal is connected to the gate terminal of the transistor Tr1 and the gate terminal of the transistor Tr2. Accordingly, when the Q signal is turned to a low level, the transistor Tr2 is turned off and the transistor Tr1 is turned on. Here, when the transistor Tr1 is turned on, the QB terminal is electrically connected to the power supply VDD, so that the QB signal is turned to a high level. In the case where the QB signal is at a high level, the transistor Tr4 is in the on state and the transistor Tr3 is in the off state. Accordingly, the Q terminal is disconnected from the power supply VDD electrically, and outputs a low level signal (Vss). With the method described above, it is possible to carry out the initialization.

(Modified Example)

Figure 4:
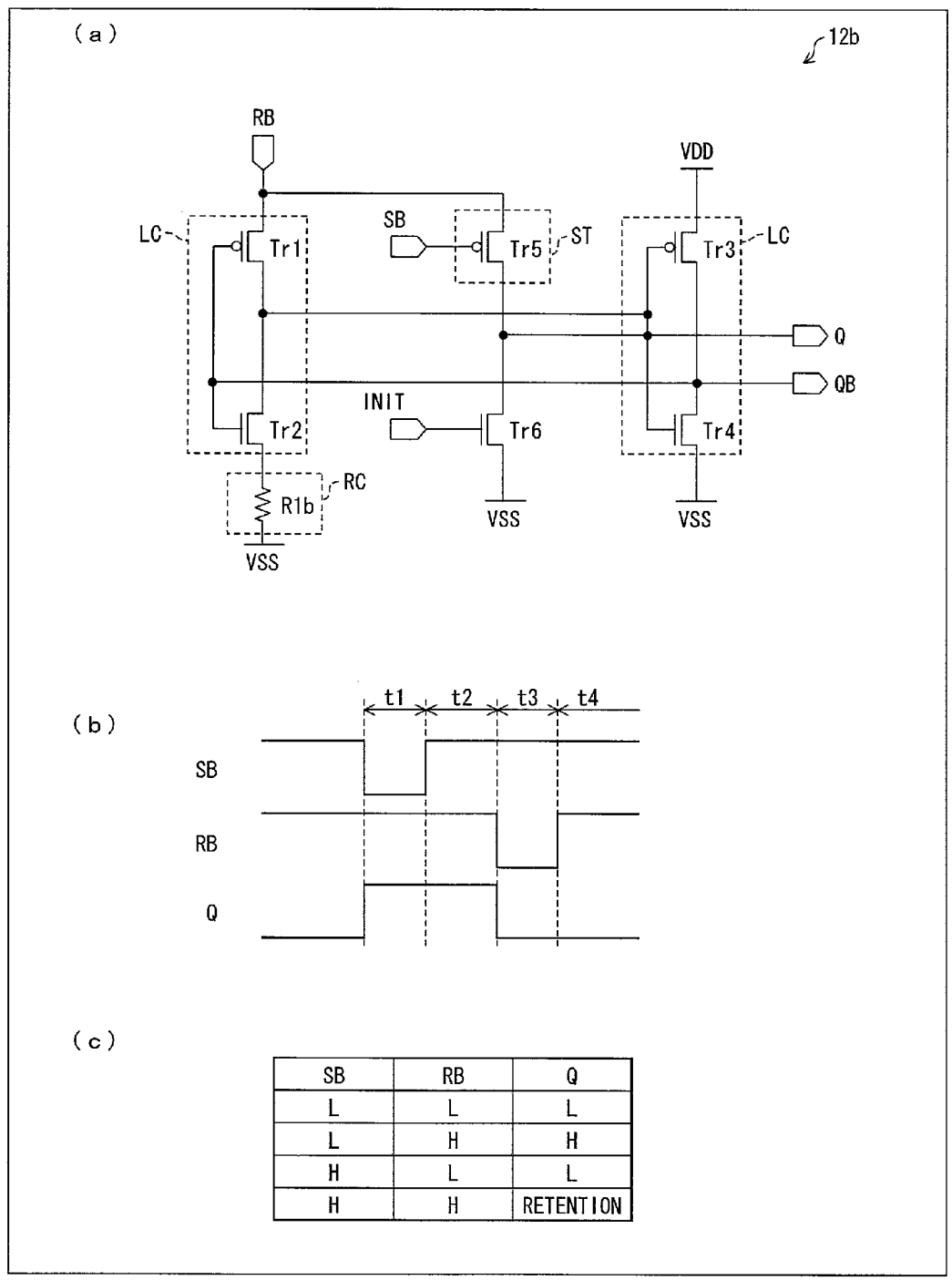

(a) of FIG. 4 is a circuit diagram illustrating an arrangement of a flip-flop circuit 12b, which is a modified example of (a) of FIG. 3. A flip-flop circuit 12b illustrated in (a) of FIG. 4 includes (i) a P channel transistor Tr1 and an N channel transistor Tr2 which constitute a CMOS circuit (first CMOS circuit), (ii) a P channel transistor Tr3 and an N channel transistor Tr4 which constitute another CMOS circuit (second CMOS circuit), (iii) a P channel transistor Tr5 and an N channel transistor Tr6 which constitute yet another CMOS circuit, (iv) a resistor Rib, (v) an SB terminal, (vi) an RB terminal, (vii) an INIT terminal, (viii) a Q terminal, and (ix) a QB terminal.

A gate terminal of the transistor Tr1, a gate terminal of the transistor Tr2, a drain terminal of the transistor Tr3, a drain terminal of the transistor Tr4, and the QB terminal are connected to each other. A drain terminal of the transistor Tr1, a drain terminal of the transistor Tr2, a gate terminal of the transistor Tr3, a gate terminal of the transistor Tr4, a drain terminal of the transistor Tr5, a drain terminal of the transistor Tr6, and the Q terminal are connected to each other. The SB terminal is connected to a gate terminal of the transistor Tr5. The RB terminal is connected to a source terminal of the transistor Tr1 and a source terminal of the transistor Tr5. The INIT terminal is connected to a gate terminal of the transistor Tr6. One end of the resistor R1b is connected to a source terminal of the transistor Tr2, and the other end of the resistor R1b is connected to a power supply VSS. A source terminal of the transistor Tr3 is connected to a power supply VDD. A source terminal of the transistor Tr4 is connected to the power supply VSS. A source terminal of the transistor Tr6 is connected to the power supply VSS.

The transistors Tr1, Tr2, Tr3, and Tr4 constitute a latch circuit LC. The resistor R1b constitutes a latch regulator circuit RC (regulator circuit). The transistor Tr5 serves as a set transistor ST (input transistor).

(b) of FIG. 4 is a timing chart showing an operation of the flip-flop circuit 12b (in a case where an INITB signal is inactive), and (c) of FIG. 4 is a truth table of the flip-flop circuit 12b (in the case where the INITB signal is inactive). A Q signal of the flip-flop circuit 12b is such that (i) it is at a low level (L: inactive) during a time period in which an SB signal is at a low level (L: active) and an RB signal is at a low level (L: active), (ii) it is at a high level (H: active) during a time period in which the SB signal is at a low level (L: active) and the RB signal is at a high level (H: inactive), (iii) it is at a low level (L: inactive) during a time period in which the SB signal is at a high level (H: inactive) and the RB signal is at a low level (L: active), and (iv) it is in a retention state during a time period in which the SB signal is at a high level (H: inactive) and the RB signal is at a high level (H: inactive) (see (b) and (c) of FIG. 4).

[Flip-Flop Circuit in Accordance with Embodiment 3]

Figure 5:
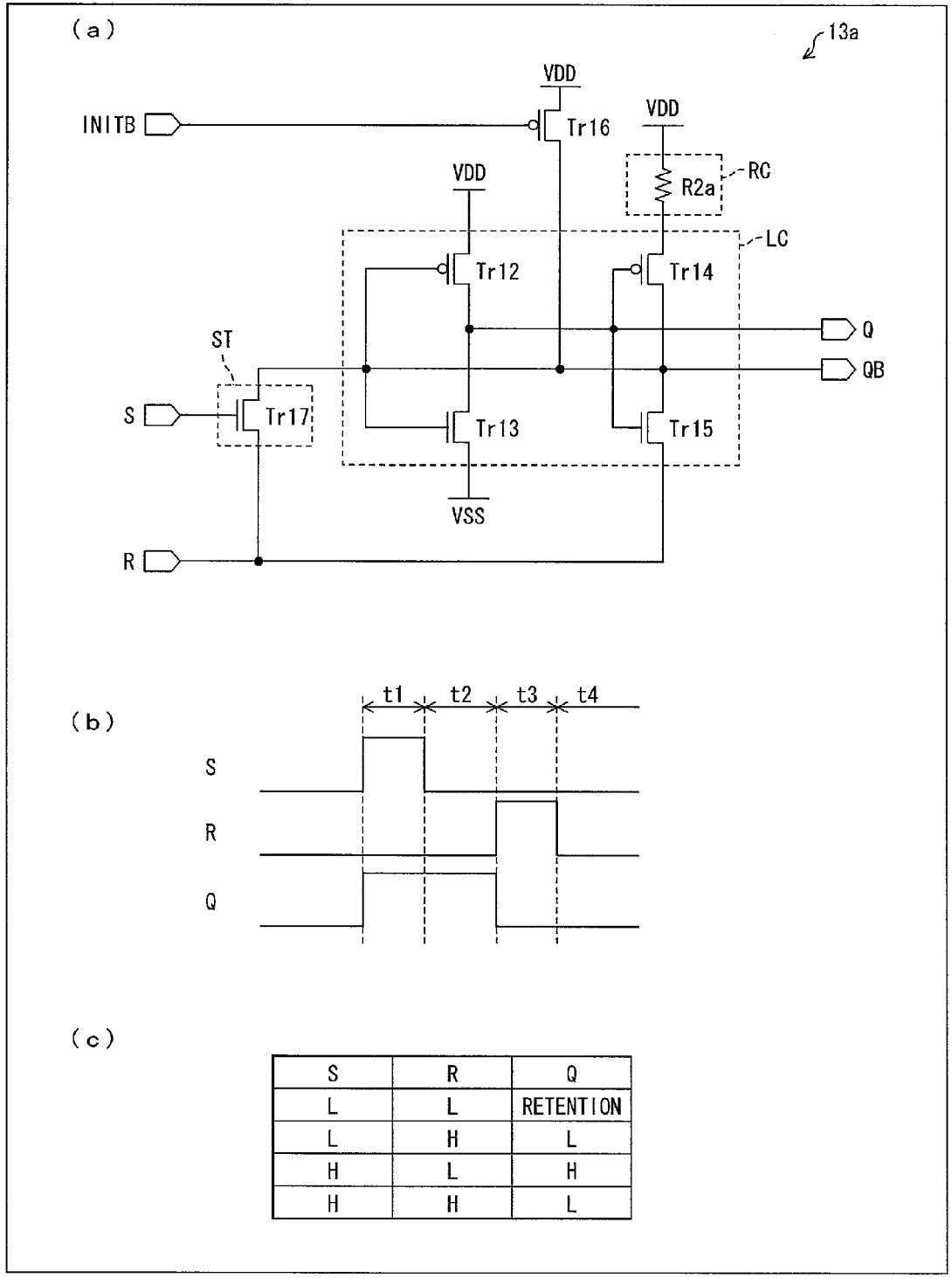

(a) of FIG. 5 is a circuit diagram illustrating an arrangement of a flip-flop circuit in accordance with Embodiment 3. A flip-flop circuit 13a illustrated in (a) of FIG. 5 includes (i) a P channel transistor Tr12 and an N channel transistor Tr13 which constitute a CMOS circuit (first CMOS circuit), (ii) a P channel transistor Tr14 and an N channel transistor Tr15 which constitute another CMOS circuit (second CMOS circuit), (iii) a P channel transistor Tr16, (iv) an N channel transistor Tr17, (v) a resistor R2a, (vi) an S terminal, (vii) an R terminal, (viii) an INITB terminal, (ix) a Q terminal, and (x) a QB terminal.

A gate terminal of the transistor Tr12, a gate terminal of the transistor Tr13, a drain terminal of the transistor Tr14, a drain terminal of the transistor Tr15, a drain terminal of the transistor Tr16, a drain terminal of the transistor Tr17, and the QB terminal are connected to each other. A drain terminal of the transistor Tr12, a drain terminal of the transistor Tr13, a gate terminal of the transistor Tr14, a gate terminal of the transistor Tr15, and the Q terminal are connected to each other. The S terminal is connected to a gate terminal of the transistor Tr17. The R terminal is connected to a source terminal of the transistor Tr17 and a source terminal of the transistor Tr15. The INITB terminal is connected to a gate terminal of the transistor Tr16. The resistor R2a has one end thereof connected to a source terminal of the transistor Tr14, and the other end thereof connected to a power supply VDD. A source terminal of the transistor Tr13 is connected to a power supply VSS. A source terminal of the transistor Tr12 is connected to the power supply VDD. A source terminal of the transistor Tr16 is connected to the power supply VDD.

The transistors Tr12, Tr13, Tr14, and Tr15 constitute a latch circuit LC. The resistor R2a constitutes a latch regulator circuit RC (regulator circuit). The transistor Tr17 serves as a set transistor ST.

(b) of FIG. 5 is a timing chart showing an S signal, an R signal, and a Q signal of the flip-flop circuit 13a, and (c) of FIG. 5 is a truth table of the flip-flop circuit 13a (in a case where an INITB signal is inactive).

The following description deals with an operation of the flip-flop circuit 13a in a case where the S signal is active (high level) and the R signal is inactive (low level) (time period t1).

In a case where the Q signal had been at a low level and the QB signal had been at a high level before the S signal was turned to be active (high level), (i) the drain terminal of the transistor Tr17 and (ii) the power supply VDD, from which Vdd is supplied to the source terminal of the transistor Tr14, are short-circuited. Note, here, that the resistor R2a is provided between the drain terminal of the transistor Tr17 and the power supply VDD, so that the driving capability of the transistor Tr14 is reduced. Accordingly, even in a case where the S signal is lower than, for example, the power supply voltage Vdd, an electric potential of the QB terminal is reduced to a level (an electric potential lower than an inversion level of an inverter) substantially equal to Vss (low level).

In a case where the electric potential at the QB terminal is reduced to be substantially equal to VSS, the transistor Tr12 is turned on and the transistor Tr13 is turned off. At this time, the Q signal is turned to a high level. The Q terminal is connected to the gate terminal of the transistor Tr14 and the gate terminal of the transistor Tr15. Accordingly, when the Q signal is turned to a high level, the transistor Tr14 is turned off and the transistor Tr15 is turned on. Since the R signal is VSS (low level), the QB signal is also turned to a low level (Vss) when the transistor Tr15 is turned on. In a case where the QB signal is at a low level, the transistor Tr12 is in the on state, and the transistor Tr12 is in the off state. In this case, the Q terminal is disconnected from VSS electrically, and outputs a high level signal (Vdd).

The following description deals with an operation of the flip-flop circuit 13a in a case where the S signal is inactive (low level) and the R signal is inactive (low level) (time period t2).

When the S signal and the R signal are turned to be inactive (low level), the transistor Tr17 is turned off. Accordingly, a state in which the S signal was before being changed is retained. That is, the state of the time period t1 (the Q signal is at a high level and the QB signal is at a low level) is retained during the time period t2.

The following description deals with an operation of the flip-flop circuit 13a in a case where the S signal is inactive (low level) and the R signal is active (high level) (time period t3). In a case where the Q signal is at a high level and the QB signal is at a low level, the transistor Tr15 is in the on state. Under the circumstances, when the R signal is turned to be active (high level), an electric potential of the QB terminal is increased to a level (an electric potential higher than the inversion level of the inverter) substantially equal to Vdd (high level).

When the electric potential at the QB terminal is increased to be substantially equal to Vdd, the transistor Tr12 is turned off and the transistor Tr13 is turned on. This turns the Q signal to a low level. The Q terminal is connected to the gate terminal of the transistor Tr14 and the gate terminal of the transistor Tr15. Accordingly, when the Q signal is turned to a low level, the transistor Tr14 is turned on and the transistor Tr15 is turned off. When the transistor Tr14 is turned on, the QB signal is turned to a high level (Vdd). In a case where the QB signal is at a high level, the transistor Tr12 is in the off state, and the transistor Tr13 is in the on state. In this case, the Q terminal is disconnected from the power supply VDD electrically, and outputs a low level signal (Vss).

The following description deals with an operation of the flip-flop circuit 13a in a case where the S signal is inactive (low level) and the R signal is inactive (low level) (time period t4).

When the S signal is turned to be inactive (low level) and the R signal is turned to be inactive (low level), the latch circuit LC is turned on. Accordingly, a state in which the R signal was before being changed is retained. That is, the state of the time period t3 (the Q signal is at a low level and the QB signal is at a high level) is retained during the time period t4.

Figure 6:
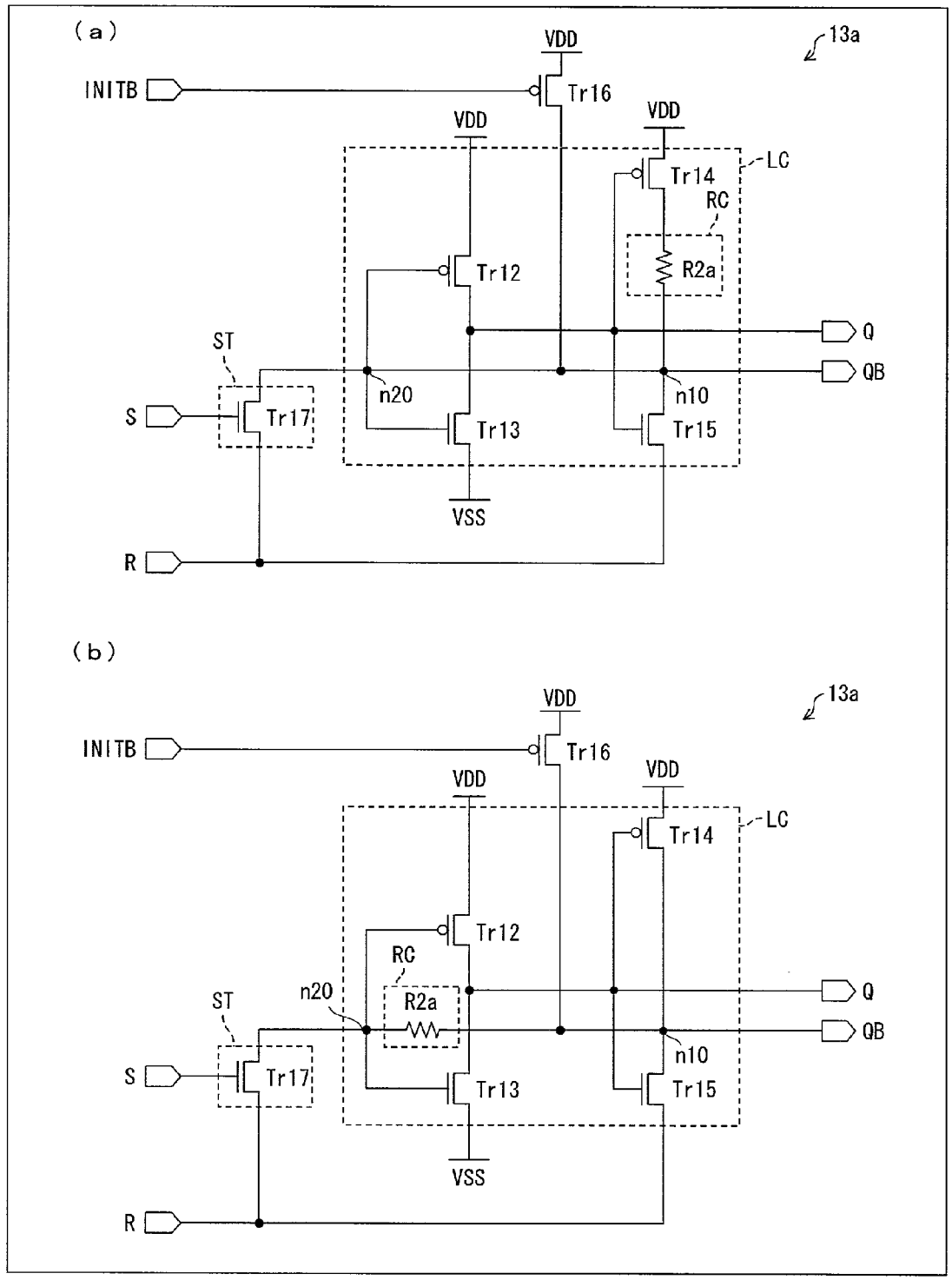
Figure 7:
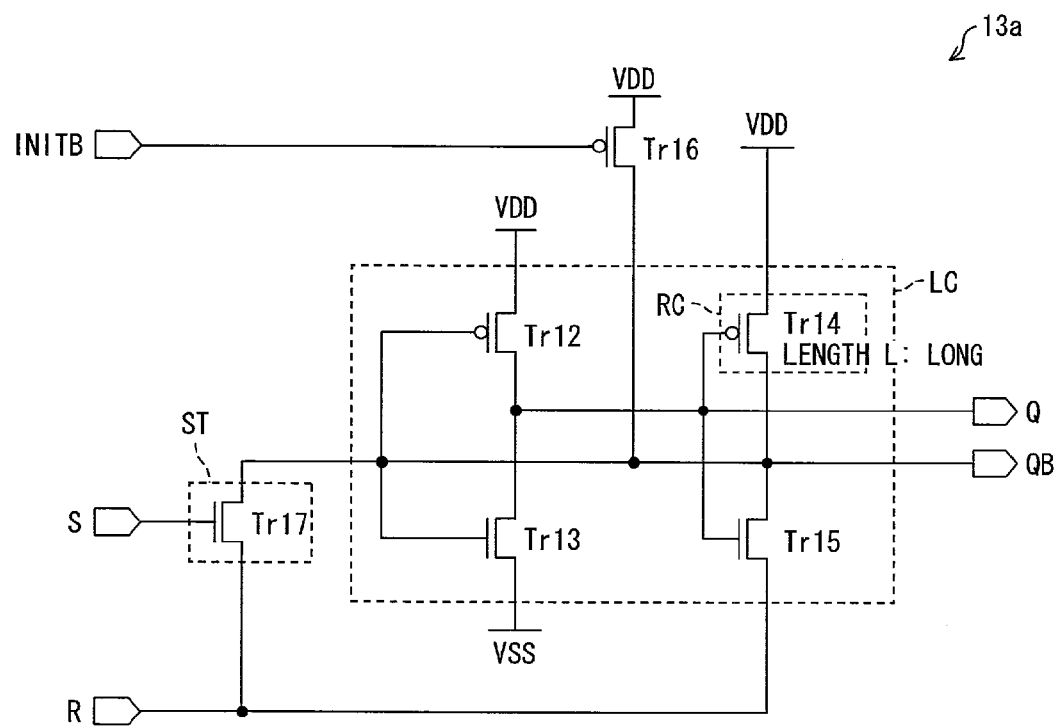

Note that a position of the resistor R2a is not limited to the one illustrated in (a) of FIG. 5. In a case where (i) a connection point (first connection point) between the drain terminal of the transistor Tr14, the drain terminal of the transistor Tr15, and the QB terminal is referred to as a node n10 and (ii) a connection point (second connection point) between the drain terminal of the transistor Tr17, the gate terminal of the transistor Tr12, and the gate terminal of the transistor Tr13 is referred to as a node n20, the resistor R2a can be provided between the drain terminal of the transistor Tr14 and the node n10 as illustrated in (a) of FIG. 6, or between the node n10 and the node n20 as illustrated in (b) of FIG. 6. That is, the resistor R2a is simply required to be provided between the power supply VDD and the node n20. It is also possible to employ an arrangement in which, as illustrated in FIG. 7, the resistor R2a is omitted, and a channel length L of the transistor Tr14 is increased or a channel width W of the transistor Tr14 is reduced. In this case, the transistor Tr14 constitutes a latch regulator circuit RC (regulator circuit). Both the arrangements illustrated in FIGS. 6 and 7 allow the driving capability of the transistor Tr14 to be reduced, and thus provides effects similar to those described above.

(Modified Example)

Figure 8:
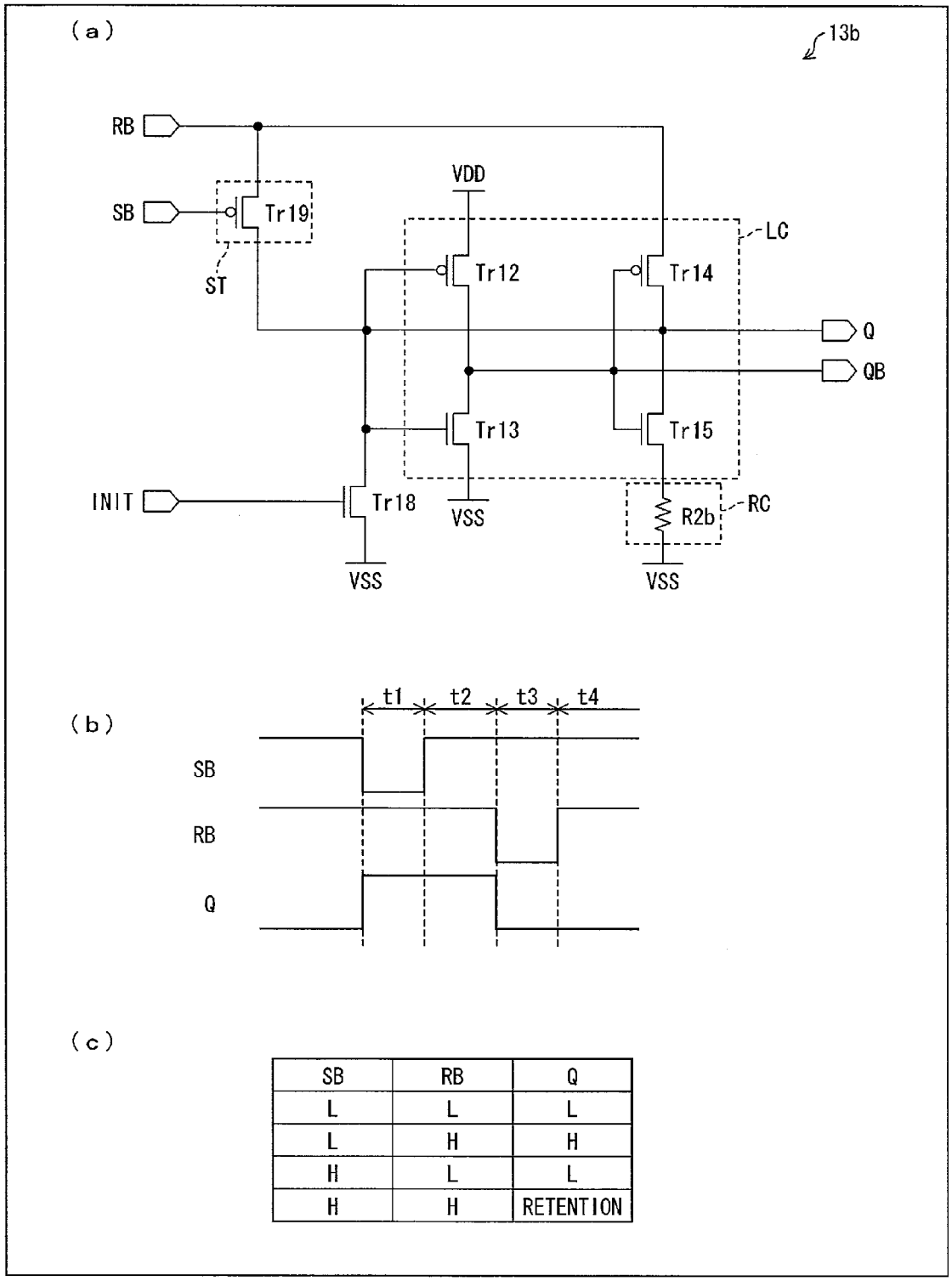

(a) of FIG. 8 is a circuit diagram illustrating an arrangement of a flip-flop circuit 13b, which is a modified example of (a) of FIG. 5. The flip-flop circuit 13b illustrated in (a) of FIG. 8 includes (i) a P channel transistor Tr12 and an N channel transistor Tr13 which constitute a CMOS circuit, (ii) a P channel transistor Tr14 and an N channel transistor Tr15 which constitute another CMOS circuit, (iii) an N channel transistor Tr18, (iv) a P channel transistor Tr19, (v) a resistor R2b (regulator circuit), (vi) an SB terminal, (vii) an RB terminal, (viii) an INIT terminal, (ix) a Q terminal, and (x) a QB terminal.

A gate terminal of the transistor Tr12, a gate terminal of the transistor Tr13, a drain terminal of the transistor Tr14, a drain terminal of the transistor Tr15, a drain terminal of the transistor Tr18, a drain terminal of the transistor Tr19, and the Q terminal are connected to each other. A drain terminal of the transistor Tr12, a drain terminal of the transistor Tr13, a gate terminal of the transistor Tr14, a gate terminal of the transistor Tr15, and the QB terminal are connected to each other. The transistor Tr18 has a gate terminal thereof connected to the INIT terminal, and a source terminal thereof connected to a power supply VSS. The transistor Tr19 has a gate terminal thereof connected to the SB terminal, and a source terminal thereof connected to the RB terminal. A source terminal of the transistor Tr14 is connected to the RB terminal. The resistor R2b has one end thereof connected to the power supply VSS, and the other end thereof connected to a source terminal of the transistor Tr15.

The transistors Tr12, Tr13, Tr14, and Tr15 constitute a latch circuit LC. The resistor R2b constitutes a latch regulator circuit RC (regulator circuit). The transistor Tr19 serves as a set transistor ST (input transistor).

(b) of FIG. 8 is a timing chart showing an SB signal, an RB signal, and a Q signal of the flip-flop circuit 13b, and (c) of FIG. 8 is a truth table of the flip-flop circuit 13b (in a case where an INIT signal is inactive). The Q signal of the flip-flop circuit 13b is such that (i) it is at a low level (L: active) during a time period in which the SB signal is at a low level (L: active) and the RB signal is at a low level (L: active), (ii) it is at a high level (H: active) during a time period in which the SB signal is at a low level (L: active) and the RB signal is at a high level (H: inactive), (iii) it is at a low level (L: inactive) during a time period in which the SB signal is at a high level (H: inactive) and the RB signal is at a low level (L: active), and (iv) it is in a retention state during a time period in which the SB signal is at a high level (H: inactive) and the RB signal is at a high level (L: inactive) (see (c) of FIG. 8).

[Flip-Flop Circuit in Accordance with Embodiment 4]

Figure 9:
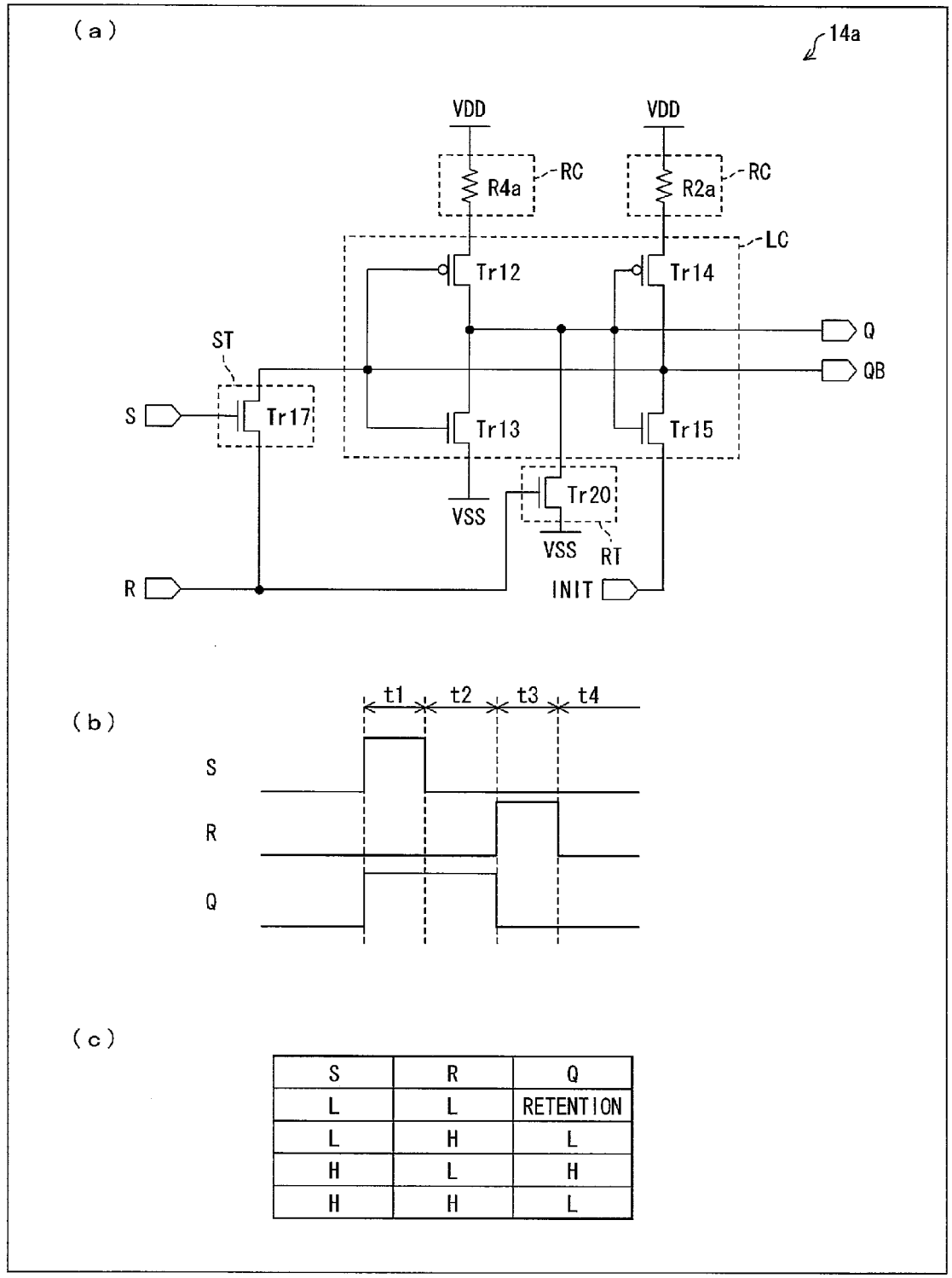

(a) of FIG. 9 is a circuit diagram illustrating an arrangement of a flip-flop circuit in accordance with Embodiment 4 of the present invention. A flip-flop circuit 14a illustrated in (a) of FIG. 9 includes (i) a P channel transistor Tr12 and an N channel transistor Tr13 which constitute a CMOS circuit, (ii) a P channel transistor Tr14 and an N channel transistor Tr15 which constitute another CMOS circuit, (iii) an N channel transistor Tr17, (iv) an N channel transistor Tr20, (v) a resistor R2a, (vi) a resistor R4a, (vii) an S terminal, (viii) an R terminal, (ix) an INIT terminal, (x) a Q terminal, and (xi) a QB terminal.

A gate terminal of the transistor Tr12, a gate terminal of the transistor Tr13, a drain terminal of the transistor Tr14, a drain terminal of the transistor Tr15, a drain terminal of the transistor Tr17, and the QB terminal are connected to each other. A drain terminal of the transistor Tr12, a drain terminal of the transistor Tr13, a gate terminal of the transistor Tr14, a gate terminal of the transistor Tr15, a drain terminal of the transistor Tr20, and the Q terminal are connected to each other. The transistor Tr20 has a gate terminal thereof connected to the R terminal, and a source terminal thereof connected to a power supply VSS. A source terminal of the transistor Tr15 is connected to the INIT terminal. The resistor R2a has one end thereof connected to a power supply VDD, and the other end thereof connected to a source terminal of the transistor Tr14. The resistor R4a has one end thereof connected to the power supply VDD, and the other end thereof connected to a source terminal of the transistor Tr12.

The transistors Tr12, Tr13, Tr14, and Tr15 constitute a latch circuit LC. The resistors R2a and R4a constitute a latch regulator circuit RC (regulator circuit). The transistor Tr17 serves as a set transistor ST. The transistor Tr20 serves as a reset transistor RT (input transistor).

(b) of FIG. 9 is a timing chart showing an S signal, an R signal, and a Q signal of the flip-flop circuit 14a, and (c) of FIG. 9 is a truth table of the flip-flop circuit 14a (in a case where an INITB signal is inactive). The Q signal of the flip-flop circuit 14a is such that (i) it is in a retention state during a time period in which the S signal is at a low level (L: inactive) and the R signal is at a low level (L: inactive), (ii) it is at a low level (L: inactive) during a time period in which the S signal is at a low level (L: inactive) and the R signal is at a high level (H: active), (iii) it is at a high level (H: active) during a time period in which the S signal is at a high level (H: active) and the R signal is at a low level (L: inactive), and (iv) it is at a low level (L: inactive) during a time period in which the S signal is at a high level (H: active) and the R signal is at a high level (H: active) (see (c) of FIG. 9).

(Modified Example)

Figure 10:
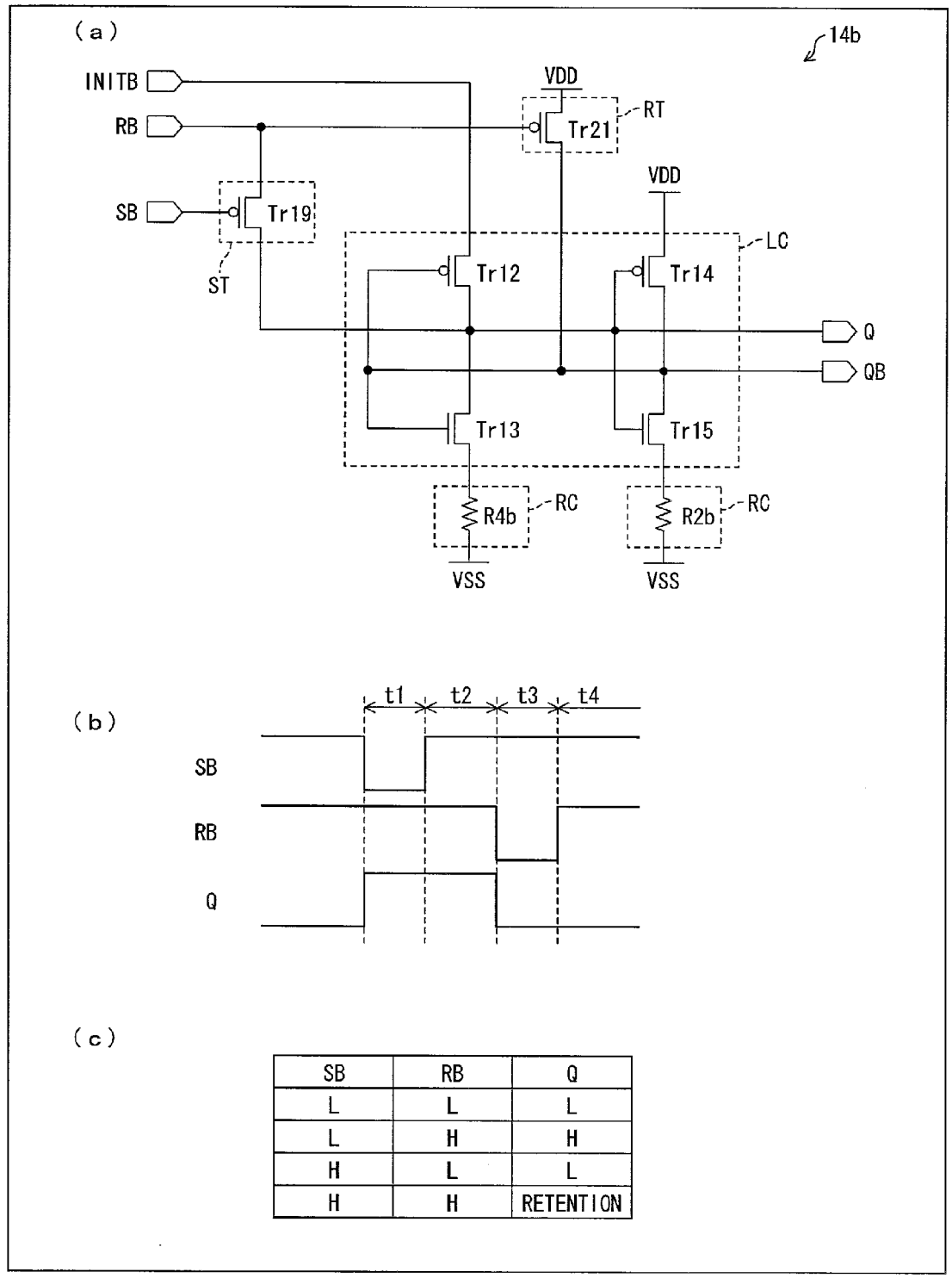

(a) of FIG. 10 is a circuit diagram illustrating an arrangement of a flip-flop circuit 14b, which is a modified example of (a) of FIG. 9. The flip-flop circuit 14b illustrated in (a) of FIG. 10 includes (i) a P channel transistor Tr12 and an N channel transistor Tr13 which constitute a CMOS circuit, (ii) a P channel transistor Tr14 and an N channel transistor Tr15 which constitute another CMOS circuit, (iii) a P channel transistor Tr19, (iv) a P channel transistor Tr21, (v) a resistor R2b, (vi) a resistor R4b, (vii) an SB terminal, (viii) an RB terminal, (ix) an INITB terminal, (x) a Q terminal, and (xi) a QB terminal.

A gate terminal of the transistor Tr12, a gate terminal of the transistor Tr13, a drain terminal of the transistor Tr14, a drain terminal of the transistor Tr15, a drain terminal of the transistor Tr21, and the QB terminal are connected to each other. A drain terminal of the transistor Tr12, a drain terminal of the transistor Tr13, a gate terminal of the transistor Tr14, a gate terminal of the transistor Tr15, a drain terminal of the transistor Tr19, and the Q terminal are connected to each other. The transistor Tr19 has a gate terminal thereof connected to the SB terminal, and a source terminal thereof connected to the RB terminal. The transistor Tr21 has a gate terminal thereof connected to the RB terminal, and a source terminal thereof connected to a power supply VDD. The transistor Tr12 has a source terminal thereof connected to the INITB terminal. The resistor R2b has one end thereof connected to a power supply VSS, and the other end thereof connected to a source terminal of the transistor Tr15. The resistor R4b has one end thereof connected to the power supply VSS, and the other end thereof connected to a source terminal of the transistor Tr13.

The transistors Tr12, Tr13, Tr14, and Tr15 constitute a latch circuit LC. The resistors R2b and R4b constitute a latch regulator circuit RC (regulator circuit). The transistor Tr19 serves as a set transistor ST. The transistor Tr21 serves as a reset transistor RT (input transistor).

(b) of FIG. 10 is a timing chart showing an SB signal, an RB signal, and a Q signal of the flip-flop circuit 14b, and (c) of FIG. 10 is a truth table of the flip-flop circuit 14b (in a case where an INIT signal is inactive). The Q signal of the flip-flop circuit 14b is such that (i) it is at a low level (L: inactive) during a time period in which the SB signal is at a low level (L: active) and the RB signal is at a low level (L: active), (ii) it is at a high level (H: active) during a time period in which the SB signal is at a low level (L: active) and the RB signal is at a high level (H: inactive), (iii) it is at a low level (L: inactive) during a time period in which the SB signal is at a high level (H: inactive) and the RB signal is at a low level (L: active), and (iv) it is in a retention state during a time period in which the SB signal is at a high level (H: inactive) and the RB signal is at a high level (H: inactive) (see (c) of FIG. 10).

[Flip-Flop Circuit in Accordance with Embodiment 5]

Figure 11:
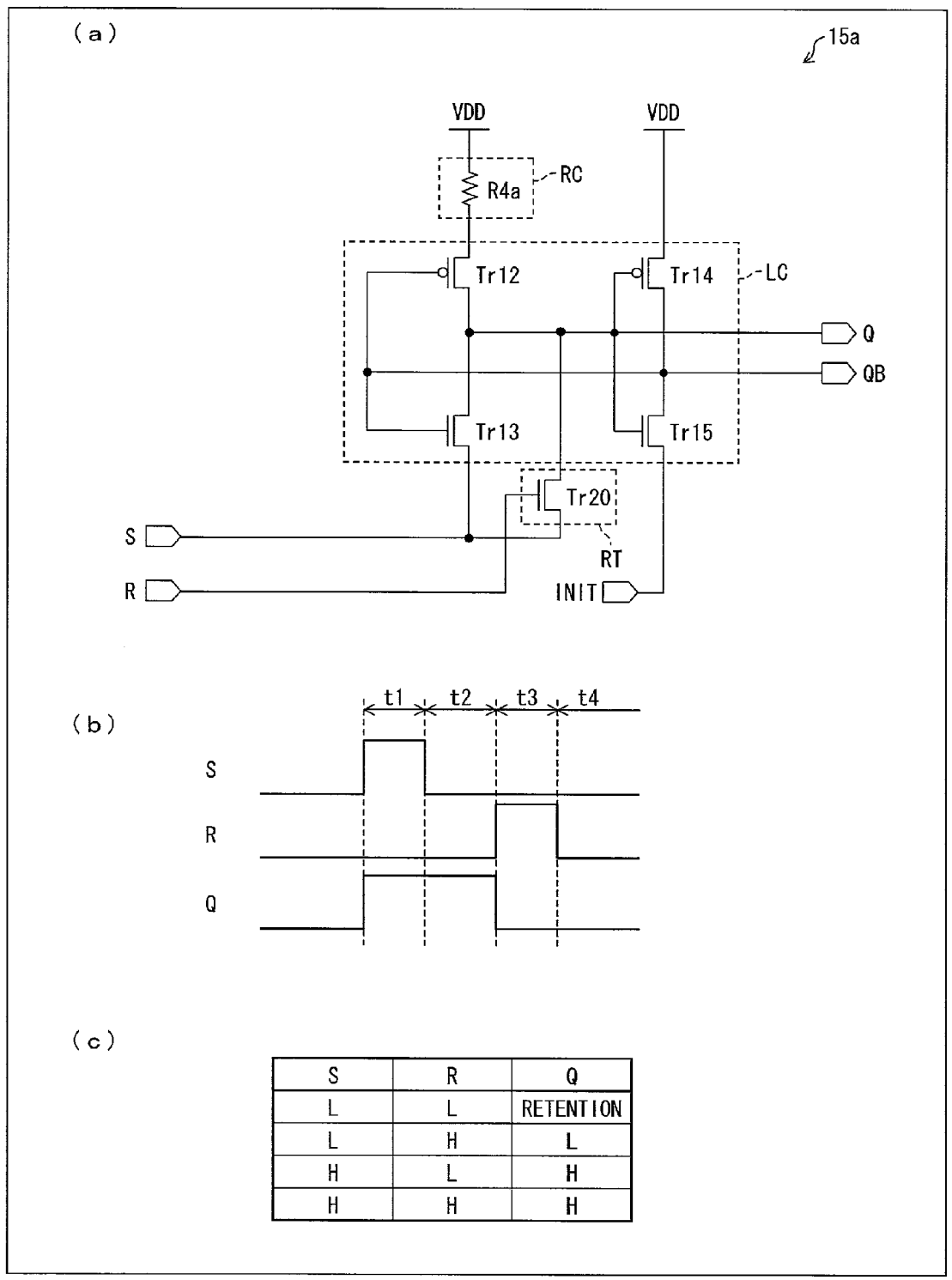

(a) of FIG. 11 is a circuit diagram illustrating an arrangement of a flip-flop circuit in accordance with Embodiment 5. A flip-flop circuit 15a illustrated in (a) of FIG. 11 includes (i) a P channel transistor Tr12 and an N channel transistor Tr13 which constitute a CMOS circuit, (ii) a P channel transistor Tr14 and an N channel transistor Tr15 which constitute another CMOS circuit, (iii) an N channel transistor Tr20, (iv) a resistor R4a, (v) an S terminal, (vi) an R terminal, (vii) an INIT terminal, (viii) a Q terminal, and (ix) a QB terminal.

A gate terminal of the transistor Tr12, a gate terminal of the transistor Tr13, a drain terminal of the transistor Tr14, a drain terminal of the transistor Tr15, and the QB terminal are connected to each other. A drain terminal of the transistor Tr12, a drain terminal of the transistor Tr13, a gate terminal of the transistor Tr14, a gate terminal of the transistor Tr15, a drain terminal of the transistor Tr20, and the Q terminal are connected to each other. The S terminal is connected to a source terminal of the transistor Tr13 and a source terminal of the transistor Tr20. The R terminal is connected to a gate terminal of the transistor Tr20. The transistor Tr15 has a source terminal thereof connected to the INIT terminal. The resistor R4a has one end thereof connected to a power supply VDD, and the other end thereof connected to a source terminal of the transistor Tr12.

The transistors Tr12, Tr13, Tr14, and Tr15 constitute a latch circuit LC. The resistor R4a constitutes a latch regulator circuit RC (regulator circuit). The transistor Tr20 serves as a reset transistor RT.

(b) of FIG. 11 is a timing chart showing an S signal, an R signal, and a Q signal of the flip-flop circuit 15a, and (c) of FIG. 11 is a truth table of the flip-flop circuit 15a (in a case where an INITB signal is inactive). The Q signal of the flip-flop circuit 15a is such that (i) it is in a retention state during a time period in which the S signal is at a low level (L: inactive) and the R signal is at a low level (L: inactive), (ii) it is at a low level (L: inactive) during a time period in which the S signal is at a low level (L: inactive) and the R signal is at a high level (H: active), (iii) it is at a high level (H: active) during a time period in which the S signal is at a high level (H: active) and the R signal is at a low level (L: inactive), and (iv) it is at a high level (H: active) during a time period in which the S signal is at a high level (H: active) and the R signal is at a high level (H: active) (see (c) of FIG. 11).

(Modified Example)

Figure 12:
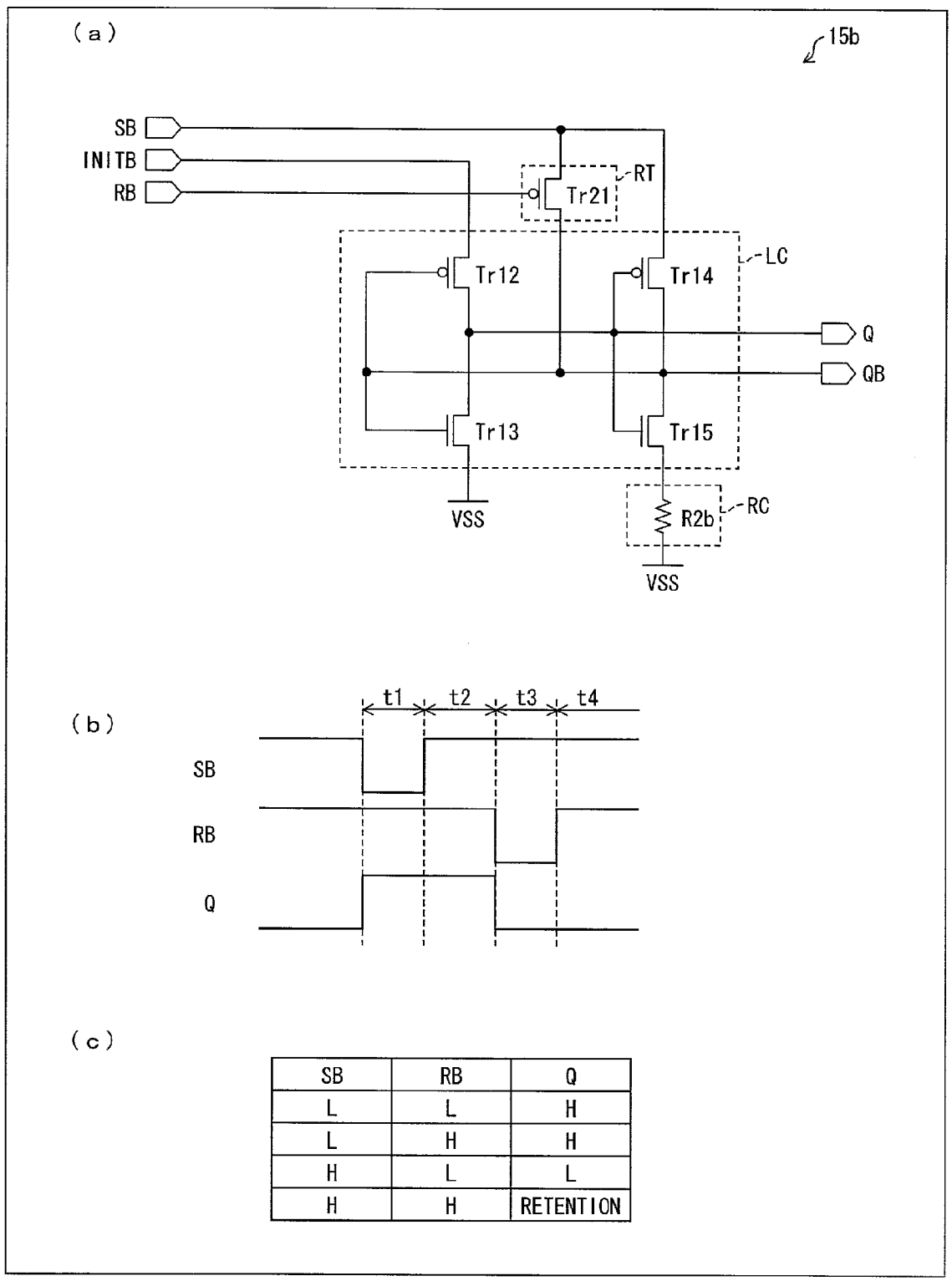

(a) of FIG. 12 is a circuit diagram illustrating an arrangement of a flip-flop circuit 15b, which is a modified example of (a) of FIG. 11. The flip-flop circuit 15b illustrated in (a) of FIG. 12 includes (i) a P channel transistor Tr12 and an N channel transistor Tr13 which constitute a CMOS circuit, (ii) a P channel transistor Tr14 and an N channel transistor Tr15 which constitute another CMOS circuit, (iii) a P channel transistor Tr21, (iv) a resistor R2b, (v) an SB terminal, (vi) an RB terminal, (vii) an INITB terminal, (viii) a Q terminal, and (ix) a QB terminal.

A gate terminal of the transistor Tr12, a gate terminal of the transistor Tr13, a drain terminal of the transistor Tr14, a drain terminal of the transistor Tr15, a drain terminal of the transistor Tr21, and the QB terminal are connected to each other. A drain terminal of the transistor Tr12, a drain terminal of the transistor Tr13, a gate terminal of the transistor Tr14, a gate terminal of the transistor Tr15, and the Q terminal are connected to each other. The SB terminal is connected to a source terminal of the transistor Tr14 and a source terminal of the transistor Tr21. The RB terminal is connected to a gate terminal of the transistor Tr21. The transistor Tr12 has a source terminal thereof connected to the INITB terminal. The resistor R2b has one end thereof connected to a power supply VSS, and the other end thereof connected to a source terminal of the transistor Tr15.

The transistors Tr12, Tr13, Tr14, and Tr15 constitute a latch circuit LC. The resistor R2b constitutes a latch regulator circuit RC (regulator circuit). The transistor Tr21 serves as a reset transistor RT.

(b) of FIG. 12 is a timing chart showing an SB signal, an RB signal, and a Q signal of the flip-flop circuit 15b, and (c) of FIG. 12 is a truth table of the flip-flop circuit 15b (in a case where an INIT signal is inactive). The Q signal of the flip-flop circuit 15b is such that (i) it is at a high level (H: active) during a time period in which the SB signal is at a low level (L: active) and the RB signal is at a low level (L: active), (ii) it is at a high level (H: active) during a time period in which the SB signal is at a low level (L: active) and the RB signal is at a high level (H: inactive), (iii) it is at a low level (L: inactive) during a time period in which the SB signal is at a high level (H: inactive) and the RB signal is at a low level (L: active), and (iv) it is in a retention state during a time period in which the SB signal is at a high level (H: inactive) and the RB signal is at a high level (L: inactive) (see (c) of FIG. 12).

[Flip-Flop Circuit in Accordance with Embodiment 6]

Figure 13:
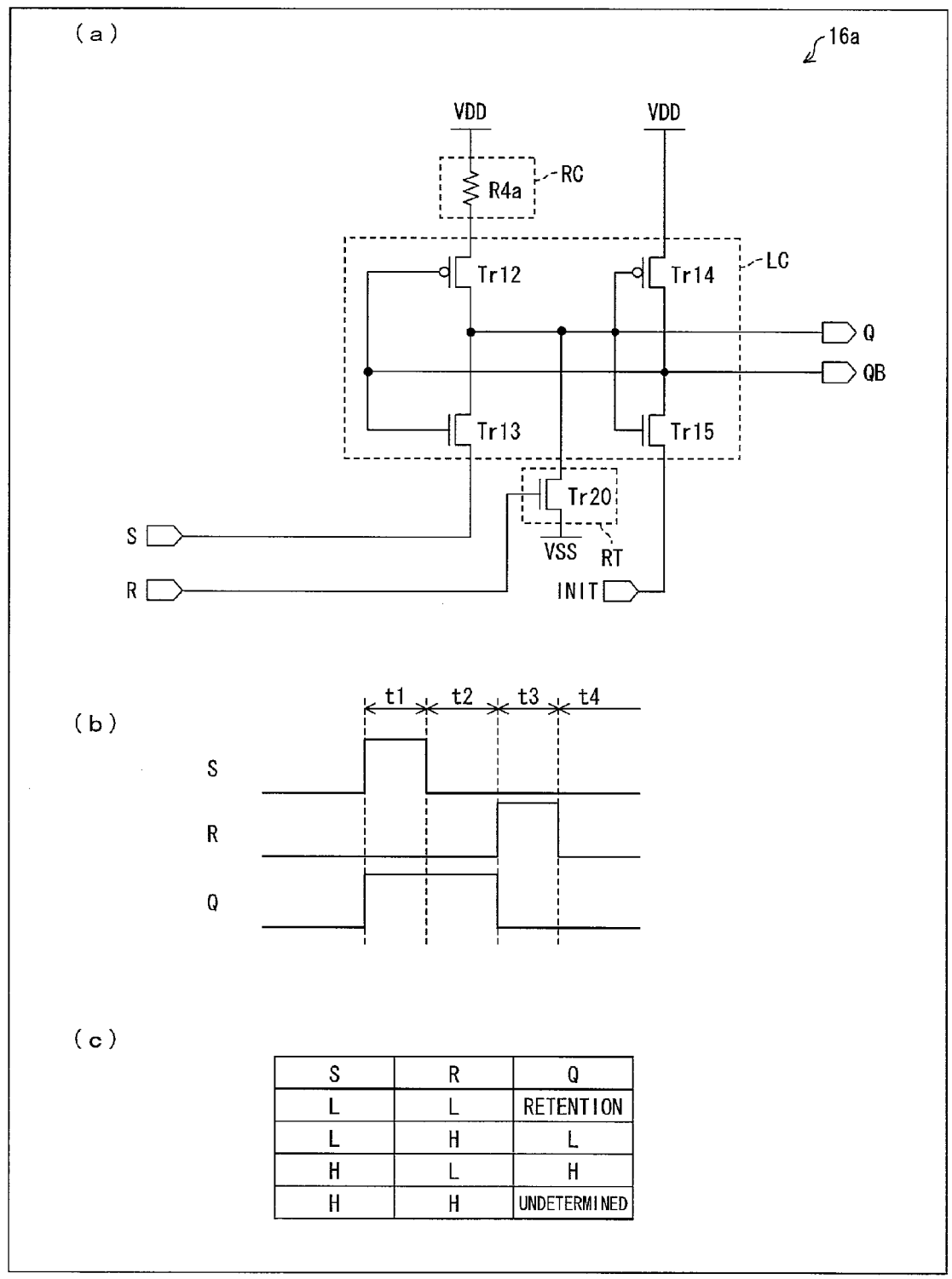

(a) of FIG. 13 is a circuit diagram illustrating an arrangement of a flip-flop circuit in accordance with Embodiment 6. A flip-flop circuit 16a illustrated in (a) of FIG. 13 includes (i) a P channel transistor Tr12 and an N channel transistor Tr13 which constitute a CMOS circuit, (ii) a P channel transistor Tr14 and an N channel transistor Tr15 which constitute another CMOS circuit, (iii) an N channel transistor Tr20, (iv) a resistor R4a, (v) an S terminal, (vi) an R terminal, (vii) an INIT terminal, (viii) a Q terminal, and (ix) a QB terminal.

A gate terminal of the transistor Tr12, a gate terminal of the transistor Tr13, a drain terminal of the transistor Tr14, a drain terminal of the transistor Tr15, and the QB terminal are connected to each other. A drain terminal of the transistor Tr12, a drain terminal of the transistor Tr13, a gate terminal of the transistor Tr14, a gate terminal of the transistor Tr15, a drain terminal of the transistor Tr20, and the Q terminal are connected to each other. The S terminal is connected to a source terminal of the transistor Tr13. The R terminal is connected to a gate terminal of the transistor Tr20. The transistor Tr20 has a source terminal thereof connected to a power supply VSS. A source terminal of the transistor Tr15 is connected to the INIT terminal. The resistor R4a has one end thereof connected to a power supply VDD, and the other end thereof connected to a source terminal of the transistor Tr12.

The transistors Tr12, Tr13, Tr14, and Tr15 constitute a latch circuit LC. The resistor R4a constitutes a latch regulator circuit RC (regulator circuit). The transistor Tr20 serves as a reset transistor RT.

(b) of FIG. 13 is a timing chart showing an S signal, an R signal, and a Q signal of the flip-flop circuit 16a, and (c) of FIG. 13 is a truth table of the flip-flop circuit 16a (in a case where an INITB signal is inactive). The Q signal of the flip-flop circuit 16a is such that (i) it is in a retention state during a time period in which the S signal is at a low level (L: inactive) and the R signal is at a low level (L: inactive), (ii) it is at a low level (L: inactive) during a time period in which the S signal is at a low level (L: inactive) and the R signal is at a high level (H: active), (iii) it is at a high level (H: active) during a time period in which the S signal is at a high level (H: active) and the R signal is at a low level (L: inactive), and (iv) it is in an undetermined state during a time period in which the S signal is at a high level (H: active) and the R signal is at a high level (H: active) (see (c) of FIG. 13).

(Modified Example)

Figure 14:
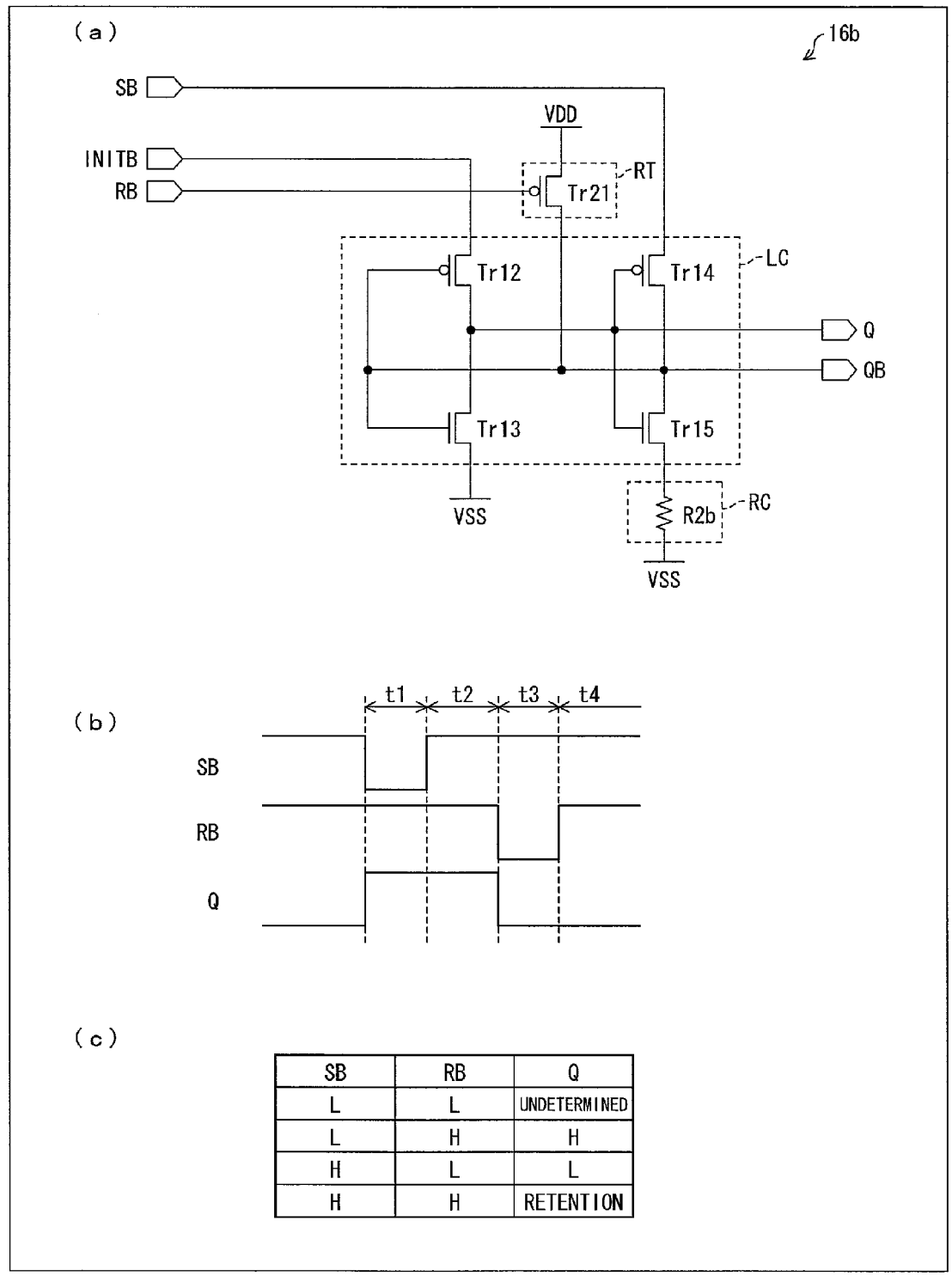

(a) of FIG. 14 is a circuit diagram illustrating an arrangement of a flip-flop circuit 16b, which is a modified example of (a) of FIG. 13. The flip-flop circuit 16b illustrated in (a) of FIG. 14 includes (i) a P channel transistor Tr12 and an N channel transistor Tr13 which constitute a CMOS circuit, (ii) a P channel transistor Tr14 and an N channel transistor Tr15 which constitute another CMOS circuit, (iii) a P channel transistor Tr21, (iv) a resistor R2b, (v) an SB terminal, (vi) an RB terminal, (vii) an INITB terminal, (viii) a Q terminal, and (ix) a QB terminal.

A gate terminal of the transistor Tr12, a gate terminal of the transistor Tr13, a drain terminal of the transistor Tr14, a drain terminal of the transistor Tr15, a drain terminal of the transistor Tr21, and the QB terminal are connected to each other. A drain terminal of the transistor Tr12, a drain terminal of the transistor Tr13, a gate terminal of the transistor Tr14, a gate terminal of the transistor Tr15, and the Q terminal are connected to each other. The SB terminal is connected to a source terminal of the transistor Tr14. The RB terminal is connected to a gate terminal of the transistor Tr21. The transistor Tr21 has a source terminal thereof connected to a power supply VDD. The transistor Tr12 has a source terminal thereof connected to the INITB terminal. The resistor R2b has one end thereof connected to a power supply VSS, and the other end thereof connected to a source terminal of the transistor Tr15.

The transistors Tr12, Tr13, Tr14, and Tr15 constitute a latch circuit LC. The resistor R2b constitutes a latch regulator circuit RC (regulator circuit). The transistor Tr21 serves as a reset transistor RT.

(b) of FIG. 14 is a timing chart showing an SB signal, an RB signal, and a Q signal of the flip-flop circuit 16b, and (c) of FIG. 14 is a truth table of the flip-flop circuit 16b (in a case where an INIT signal is inactive). The Q signal of the flip-flop circuit 16b is such that (i) it is in an undetermined state during a time period in which the SB signal is at a low level (L: active) and the RB signal is at a low level (L: active), (ii) it is at a high level (H: active) during a time period in which the SB signal is at a low level (L: active) and the RB signal is at a high level (H: inactive), (iii) it is at a low level (L: inactive) during a time period in which the SB signal is at a high level (H: inactive) and the RB signal is at a low level (L: active), and (iv) it is in a retention state during a time period in which the SB signal is at a high level (H: inactive) and the RB signal is at a high level (L: inactive) (see (c) of FIG. 14).

The flip-flop circuits described above are each applicable to a shift register or various display drive circuits of a liquid crystal display device, as described in the following example case.

[Application to Shift Register]

Figure 15:
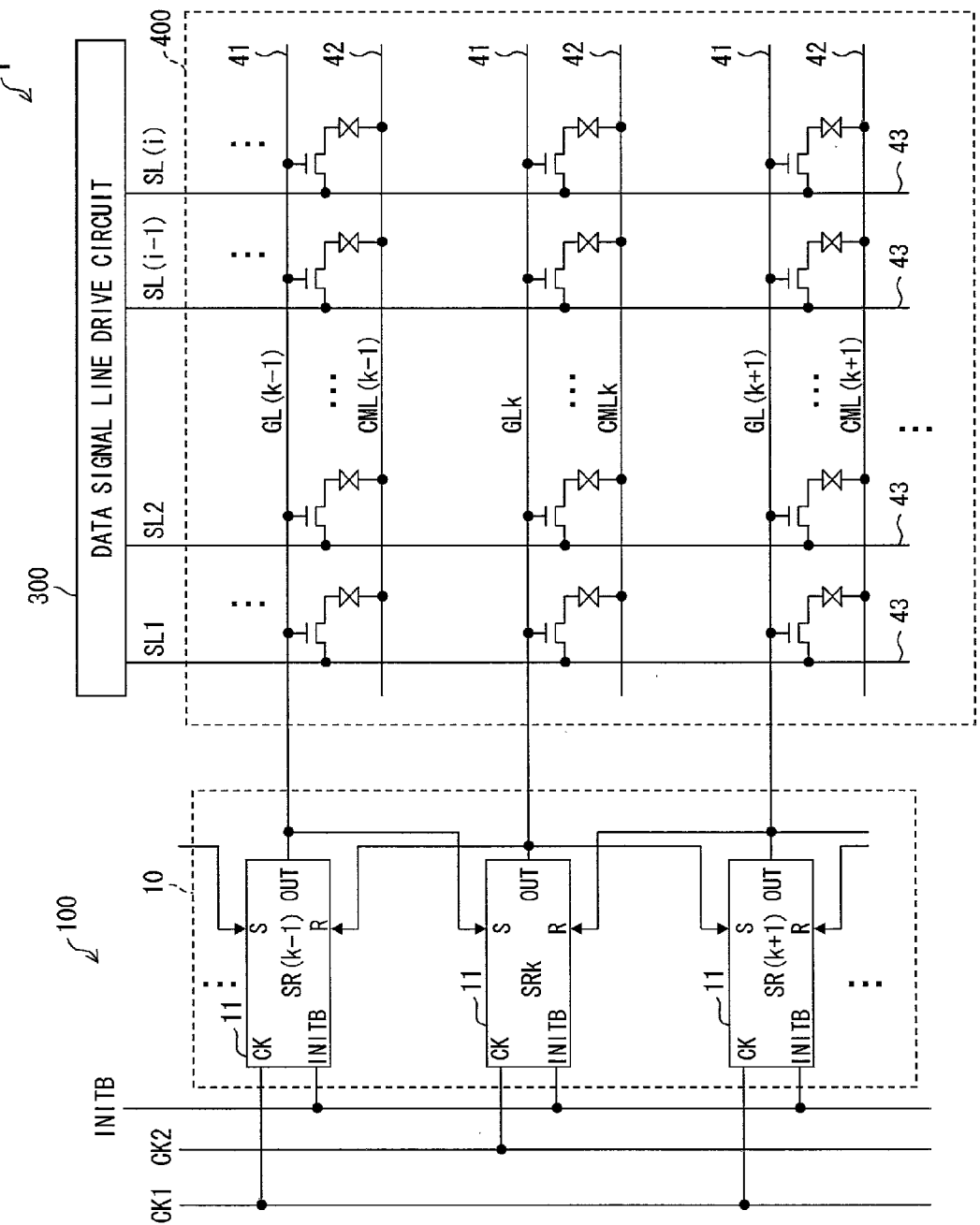
FIG. 15 is a block diagram schematically illustrating an arrangement of a liquid crystal display device of the present invention.
Figure 16:
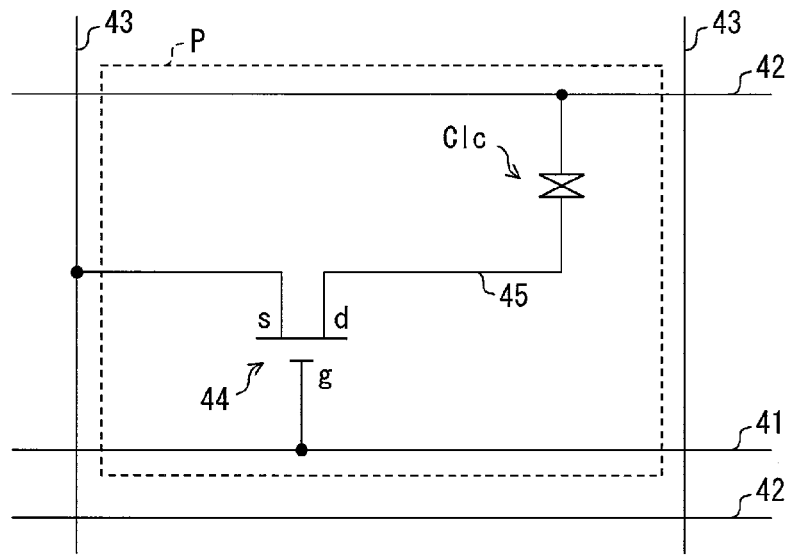
FIG. 16 is an equivalent circuit diagram illustrating an electric configuration of a pixel of the liquid crystal display device illustrated in FIG. 15.

FIG. 15 is a block diagram schematically illustrating an arrangement of a liquid crystal display device 1. FIG. 16 is an equivalent circuit diagram illustrating an electric configuration of a pixel of the liquid crystal display device 1.

The following description will discuss, with reference to FIGS. 15 and 16, a schematic configuration of the liquid crystal display device 1. The liquid crystal display device 1 includes a scanning signal line drive circuit 100, a data signal line drive circuit 300, and a display panel 400. The liquid crystal display device 1 also includes a control circuit (not shown) for controlling various drive circuits. Note that the various drive circuits can be manufactured in an active matrix substrate monolithically.

The display panel 400 is constituted by an active matrix substrate (not shown), a counter substrate (not shown), and liquid crystal provided between the active matrix substrate and the counter substrate. The display panel 400 includes a large number of pixels P (FIG. 16) arranged in matrix.

The display panel 400 includes, on the active matrix substrate, scanning signal lines 41 (GLn), data signal lines 43 (SLi), thin film transistors (may hereinafter referred to as "TFTs") 44, and pixel electrodes 45. The display panel 400 also includes common lines (common electrode wiring) 42 (CMLn) on the counter substrate. Note that i and n are each an integer equal to or greater than 2.

The scanning signal lines 41 are provided, one scanning signal line 41 per row, so as to be parallel with each other in a row direction (lateral direction). The data signal lines 43 are provided, one data signal line 43 per column, so as to be parallel with each other in a column direction (longitudinal direction). As illustrated in FIG. 16, the TFTs 44 are provided so as to correspond to the respective intersections of the scanning signal lines 41 and the data signal lines 43, and the pixel electrodes 45 are provided so as to correspond to the respective intersections of the scanning signal lines 41 and the data signal lines 43. A TFT 44 has a gate electrode g thereof connected to a scanning signal line 41, a source electrode s thereof connected to a data signal line 43, and a drain electrode d thereof connected to a pixel electrode 45. A capacitor C1c (including a liquid crystal capacitor) is formed between the pixel electrode 45 and a common line 42.

With the arrangement, when (i) a gate of the TFT 44 is turned on by means of a gate signal (scanning signal) supplied to the scanning signal line 41 and (ii), accordingly, a source signal (data signal) supplied from the data signal line 43 is written into the pixel electrode 45, an electric potential of the pixel electrode 45 is set in accordance with the source signal. As a result, a voltage is applied to the liquid crystal interposed between the pixel electrode 45 and the common line 42, in accordance with the source signal. This makes it possible to carry out gradation display in accordance with the source signal.

The display panel 400 having a configuration as described above is driven by the scanning signal line drive circuit 100, the data signal line drive circuit 300, and the control circuit which drives the scanning signal line drive circuit 100 and the data signal line drive circuit 300.

In the present embodiment, in an active period (valid scanning period) in a vertical scanning period which is periodically repeated, (i) horizontal scanning periods are sequentially allocated to rows and (ii) the rows are sequentially scanned.

As such, gate signals, each of which is for turning on a TFT 44, are supplied from the scanning signal line drive circuit 100 sequentially to the scanning signal lines 41 in synchronization with horizontal scanning periods of respective rows.

Further, source signals are supplied from the data signal line drive circuit 300 to the respective data signal lines 43. The source signals supplied to the data signal lines 43 are signals which are obtained by (i) supplying video signals from an outside of the liquid crystal display device 1 to the data signal line drive circuit 300 via the control circuit, (ii) allocating the video signals to respective rows by means of the data signal line drive circuit 300 and (iii) subjecting the video signals to a process such as boosting by means of the data signal line drive circuit 300.

The control circuit controls the scanning signal line drive circuit 100 and the data signal line drive circuit 300 to output a gate signal, a source signal, and a common signal.

A shift register 10, which constitutes the scanning signal line drive circuit 100, is constituted by m unit circuits 11 (where m is an integer equal to or greater than 2) which are provided in respective stages so as to be connected to each other. As illustrated in FIG. 15, each of the unit circuits 11 includes a clock terminal (CK terminal), a set terminal (S terminal), a reset terminal (R terminal), an initialization terminal (INITB terminal), and an output terminal OUT.

The shift register 10 receives, from outside, (i) a start pulse (not shown) and (ii) clock signals CK1 and CK2 having respective two phases. The start pulse is supplied to an S terminal of a unit circuit 11 of a first stage. The clock signal CK1 is supplied to CK terminals of unit circuits 11 of odd stages, and the clock signal CK2 is supplied to CK terminals of unit circuits 11 of even stages. An output of a unit circuit 11 is outputted, as an output signal SROUT, via an output terminal OUT of the unit circuit 11 to a corresponding scanning signal line GL so as to be supplied to an S terminal of a unit circuit 11 of a subsequent stage and to an R terminal of a unit circuit 11 of a preceding stage.

Specifically, as illustrated in FIG. 15, an S terminal of a unit circuit 11 of a k-th stage (k is an integer in a range of 1 to m) of the shift register 10 receives an output signal SROUT(k−1) supplied from a unit circuit 11 of a (k−1)-th stage, and the unit circuit 11 of the k-th stage supplies an output signal SROUTk to a scanning signal line GLk. In this manner, the shift register 10 carries out a shift operation so as to supply output signals SROUT1 through SROUTn sequentially to respective scanning signal lines GL1 through GLn. Note that the output signal SROUTk outputted from the unit circuit 11 of the k-th stage is supplied to an R terminal of the unit circuit 11 of the (k−1)-th stage and to an S terminal of a unit circuit 11 of a (k+1)-th stage.

The following description deals with details of an arrangement of the shift register 10.

Figure 17:
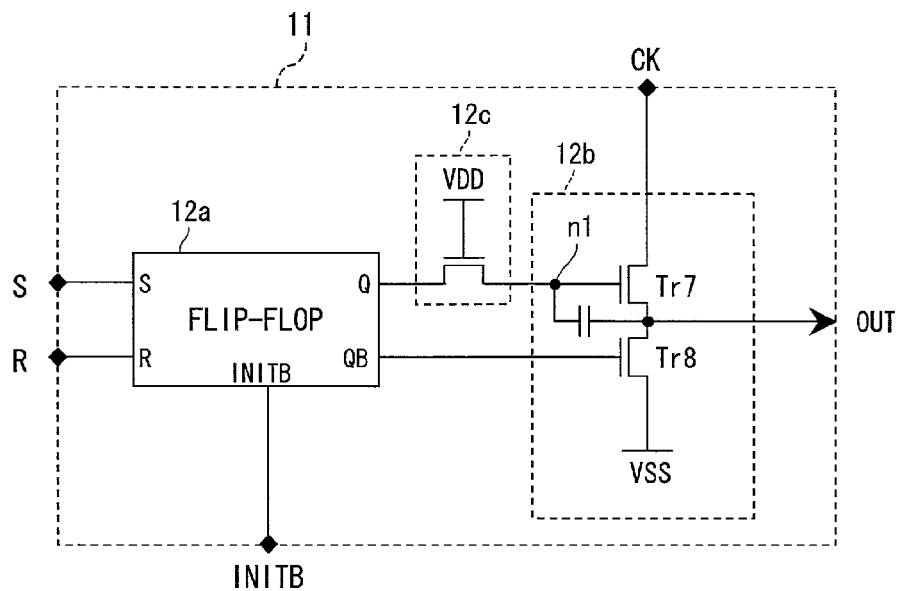
FIG. 17 is a block diagram illustrating an arrangement of a unit circuit included in a shift register of the liquid crystal display device.
Figure 18:
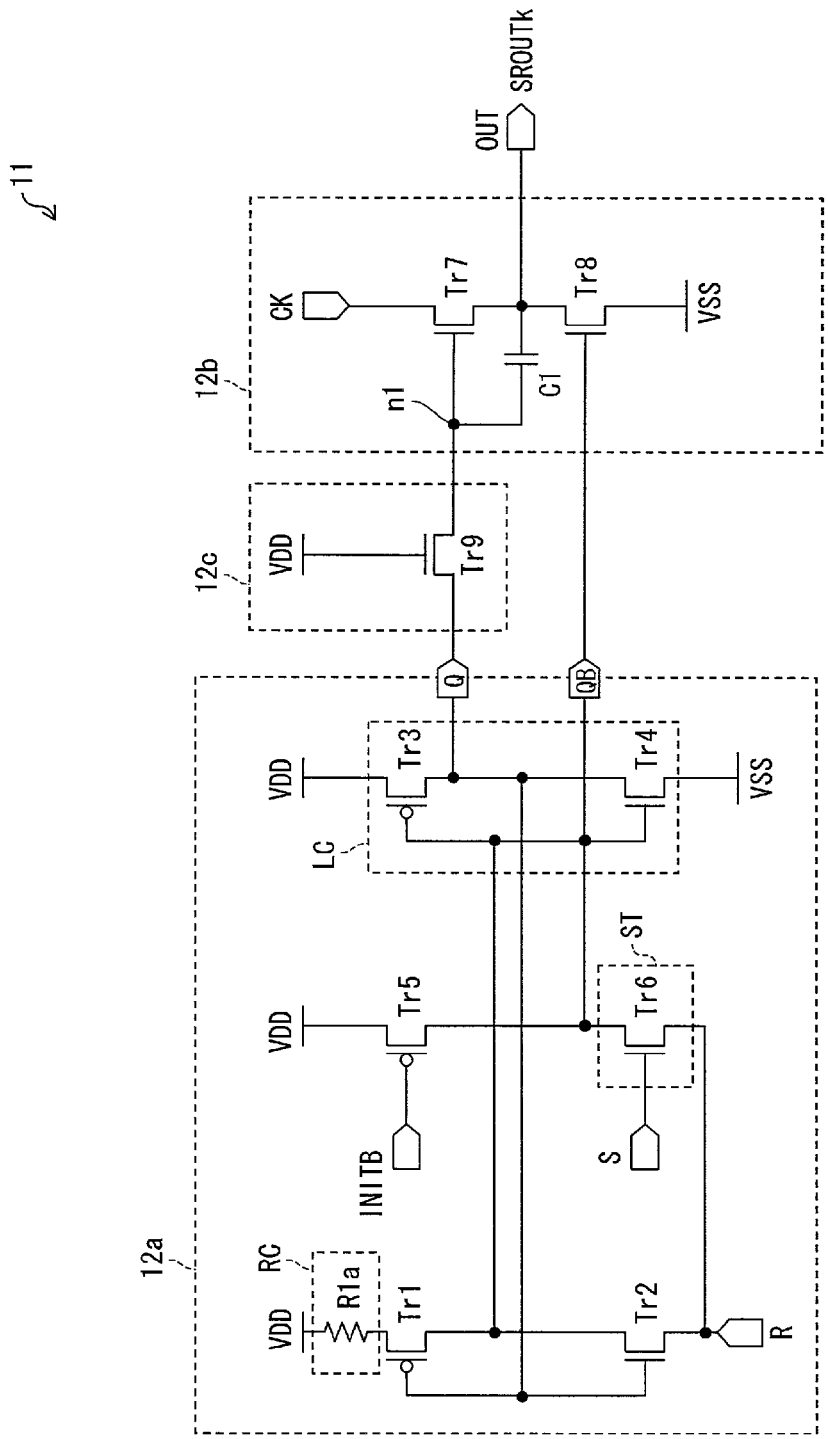
FIG. 18 is a circuit diagram of a unit circuit included in a shift register of the liquid crystal display device.

FIGS. 17 and 18 are each a circuit diagram of a unit circuit 11 constituting each stage of the shift register 10. As illustrated in FIGS. 17 and 18, the unit circuit 11 includes a set/reset type flip-flop circuit 12a (see FIG. 3), a switching circuit 12b, and a floating control circuit 12c. An S terminal, an R terminal, and an INIT terminal of the flip-flop circuit 12a receives a set signal, a reset signal, and an initialization signal (INIT signal), respectively. The flip-flop circuit 12a outputs a Q signal via a Q terminal, and a QB signal via a QB terminal. Note that the S signal (set signal), the R signal (reset signal), the INIT signal (initial signal), and the Q signal (output signal) are signals which are at a high level when these are active. The SB signal (set-bar signal), the RB signal (reset-bar signal), the INITB signal (initial-bar signal), and the QB signal (inversion output signal) are signals which are at a low level when these are active.

The flip-flop circuit 12a illustrated in FIG. 18 includes (i) a P channel transistor Tr1 and an N channel transistor Tr2 which constitute a CMOS circuit (first CMOS circuit), (ii) a P channel transistor Tr3 and an N channel transistor Tr4 which constitutes another CMOS circuit (second CMOS circuit), (iii) a P channel transistor Tr5 and an N channel transistor Tr6 which constitute yet another CMOS circuit, and (iv) a resistor R1a (latch regulator circuit RC).

The switching circuit 12b is constituted by an N channel transistor Tr7 (output transistor), Tr8, and a capacitor C1.

The floating control circuit 12c is constituted by an N channel transistor Tr9 (control transistor). Note that the capacitor C1 can be provided as an element, or formed as a parasitic capacitance.

The transistor Tr6 has a gate terminal thereof connected to the S terminal, a source terminal thereof connected to the R terminal, and a drain terminal thereof connected to a gate terminal of each of the transistors Tr3 and Tr4. The transistor Tr5 has a gate terminal thereof connected to the INITB terminal, a source terminal thereof connected to a power supply VDD, and a drain terminal thereof connected to the gate terminal of each of the transistors Tr3 and Tr4. The transistor Tr3 has the gate terminal thereof connected to the drain terminal of each of the transistors Tr5 and Tr6, a source terminal thereof connected to the power supply VDD, and a drain terminal thereof connected to the Q terminal. The transistor Tr4 has the gate terminal thereof connected to the drain terminal of each of the transistors Tr5 and Tr6, a source terminal thereof connected to a power supply VSS, and a drain terminal thereof connected to the Q terminal. The resistor R1a has one terminal thereof connected to the power supply VDD. The transistor Tr1 has a gate terminal thereof connected to the drain terminal of each of the transistors Tr3 and Tr4 and to the Q terminal, a source terminal thereof connected to the other terminal of the resistor R1a, and a drain terminal thereof connected to the gate terminal of each of the transistors Tr3 and Tr4 and to the QB terminal. The transistor Tr2 has a gate terminal thereof connected to the drain terminal of each of the transistors Tr3 and Tr4 and to the Q terminal, a source terminal thereof connected to the R terminal, and a drain terminal thereof connected to the gate terminal of each of the transistors Tr3 and Tr4 and to the QB terminal.

The transistor Tr9 of the floating control circuit 12c has a gate terminal thereof connected to the power supply VDD, and a source terminal thereof connected to the Q terminal. The transistor Tr7 of the switching circuit 12b has a gate terminal thereof connected to a drain terminal of the transistor Tr9, a source terminal thereof connected to the CK terminal, and a drain terminal thereof connected to the output terminal OUT. The transistor Tr8 has a gate terminal thereof connected to the QB terminal, a source terminal thereof connected to the power supply VSS, and a drain terminal thereof connected to the output terminal OUT. The capacitor C1 is located between the gate terminal and the drain terminal of the transistor Tr7. Note that a connection point between (i) the capacitor C1, (ii) the gate terminal of the transistor Tr7, and (iii) drain terminal of the transistor Tr9 is referred to as node n1.

With the arrangement, the S terminal of the unit circuit 11 of the k-th stage receives the output signal SROUT(k−1) supplied from the unit circuit 11 of the (k−1)-th stage, and the output signal SROUTk is supplied from the output terminal OUT of the unit circuit 11 of the k-th stage to the scanning signal line GLk of a k-th row. The output signal SROUTk is supplied to the S terminal of the unit circuit 11 of the (k+1)-th stage and to the R terminal of the unit circuit 11 of the (k−1)-th stage.

(Operations)

Figure 19:
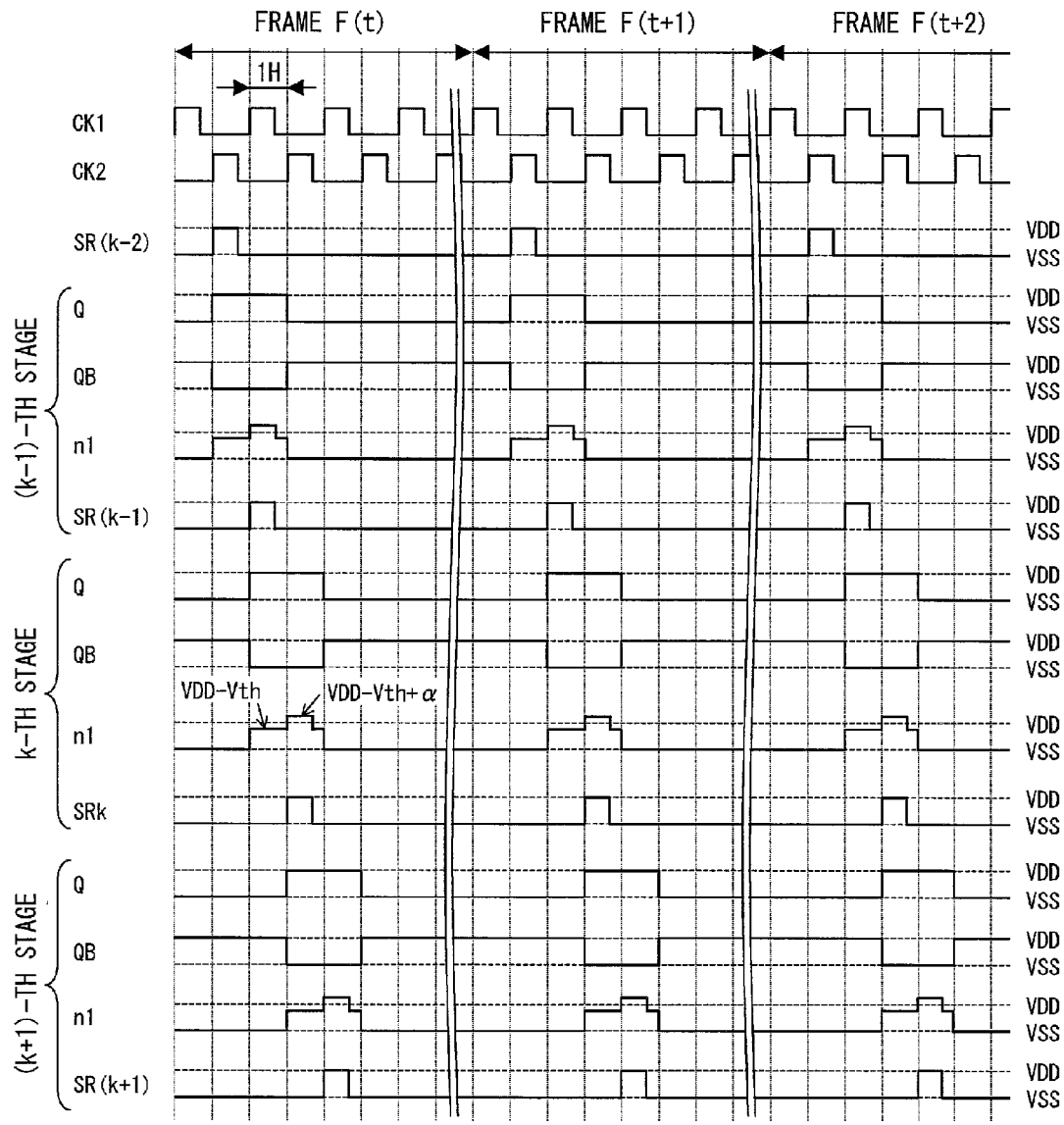
FIG. 19 is a timing chart showing an operation of the shift register 10.

The following description discusses, with reference to FIG. 19, an operation of the shift register 10. FIG. 19 is a timing chart showing an operation of the shift register 10. FIG. 19 shows an input signal and an output signal of each of the unit circuit 11 of the (k−1)-th stage, the unit circuit 11 of the k-th stage, and the unit circuit 11 of the (k+1)-th stage.

SR(k−2), SR(k−1), SRk, and SR(k+1) respectively represent (i) an electric potential of an output signal SROUT(k−2) of a unit circuit 11 of a (k−2)-th stage of the shift register 10, (ii) an electric potential of an output signal SROUT(k−1) of the unit circuit 11 of the (k−1)-th stage, (iii) an electric potential of an output signal SROUTk of the unit circuit 11 of the k-th stage, and (iv) an electric potential of an output signal SROUT(k+1) of the unit circuit 11 of the (k+1)-th stage. n1 represents an electric potential of the node n1 shown in FIG. 18. Note that a time period from a point when an output signal SROUT(k−2) is outputted to a point when the next output signal SROUT(k−2) is outputted corresponds to one (1) horizontal scanning time period (one (I) frame). FIG. 19 shows given consecutive frames F(t), F(t+1), and F(t+2).

An operation of a unit circuit 11 is identical among the stages. The following description deals with the unit circuit 11 of the k-th stage.

First, a setting operation will be described. In a frame F1, the S terminal of the unit circuit 11 of the k-th stage (see FIG. 18) receives an output signal SROUT(k−1) (high level (active)) supplied from the unit circuit 11 of the (k−1)-th stage of the shift register 10. Note, here, that before the S terminal receives the output signal SROUT(k−1) at the high level, (i) the Q signal is at a low level, (ii) the QB signal is at a high level, and (iii) the drain terminal of the transistor Tr6 and the power supply VDD are short-circuited. Accordingly, in a case where an electric potential of SROUT(k−1) supplied to the S terminal is falls short of a threshold (Vth) and is lower than a power supply voltage Vdd, the transistor Tr6 is not reliably turned on. However, the unit circuit 11 has an arrangement in which the resistor R1a (regulator circuit) is provided between the drain terminal of the transistor Tr6 and the power supply VDD. This allows the driving capability of the transistor Tr1 to be reduced, thereby making it possible to turn on the transistor Tr6 and reduce an electric potential of the drain terminal of the transistor Tr6 to a level (an electric potential higher than an inversion level of an inverter) substantially equal to VSS (low level). This makes it possible to prevent malfunction of the flip-flop circuit 12a.

When the output signal SROUT(k−1) is at a high level (active), the output signal SROUT(k+1) of the unit circuit 11 of the (k+1)-th stage is at a low level (inactive). Accordingly, the transistor Tr3 is turned on, the transistor Tr4 is turned state, the Q signal is turned to a high level, and the QB signal is turned to a low level. When the Q signal is turned to the high level, an electric potential of the node n1 is increased to VDD-Vth (threshold). Then, the transistor Tr9 is turned off, and the transistor Tr7 is turned on as a result of receiving VDD-Vth.

Subsequently, when the output signal SROUT(k−1) at the S terminal is turned to a low level (inactive), the transistor Tr6 is turned off. Here, the Q signal (high level) is supplied (fed back) to the gate terminal of each of the transistors Tr1 and Tr2, so that the transistor Tr2 is turned on. Accordingly, a low level signal of the R terminal is supplied to the gate terminal of each of the transistor Tr3 and Tr4 via the transistor Tr2. Accordingly, the output (Q signal) of the flip-flop circuit 12a is maintained at a high level.

Subsequently, when the clock signal CK2 is turned to a high level (VDD), an electric potential of the drain terminal of the transistor Tr7 is turned to VDD-Vth. At this time, the transistor Tr9 is in an off state and the node n1 is in a floating state. Accordingly, the capacitor C1 causes the electric potential of the node n1 to be increased to VDD-Vth+α. This causes the gate terminal of the transistor Tr7 to receive an electric potential equal to or higher than VDD, so that VDD of the clock signal CK2 passes through the transistor Tr7 without falling short of the threshold (bootstrap operation). Accordingly, the output signal SROUTk at a high level (VDD) is outputted as it is. Then, since the transistor Tr9 is in the off state, the electric potential of the node n1 is maintained at VDD-Vth+α, and the output signal SROUTk is maintained at the high level (VDD). Note that the output signal SROUTk is supplied to the R terminal of the unit circuit 11 of the (k−1)-th stage and to the S terminal of the unit circuit 11 of the (k+1)-th stage. Further, since the transistor Tr9 is in the off state, the output (Q signal) of the flip-flop circuit 12a does not have a high voltage above the high level even in a case where the node n1 is turned to a high voltage. This makes it possible to prevent the transistors Tr2 and Tr4, which constitute the flip-flop circuit 12a, from having a voltage breakdown.

Subsequently, when the clock signal CK2 is turned to a low level (VSS), the output signal SROUTk is turned to a low level (VSS). At this time, the electric potential of the node n1 is turned to be VDD-Vth.

When the unit circuit 11 of the (k+1)-th stage receives an output signal SROUTk at the high level (VDD) from the unit circuit 11 of the k-th stage, the unit circuit 11 of the (k+1)-th stage carries out the same operation as the unit circuit 11 of the k-th stage, so that the unit circuit 11 of the (k+1)-th stage outputs an output signal SROUT(k+1) at a high level (VDD). The output signal SROUT(k+1) is supplied to the R terminal of the unit circuit 11 of the k-th stage and to an S terminal of the unit circuit 11 of the (k+2)-th stage.

The following description will discuss a resetting operation carried out by the unit circuit 11 of the k-th stage.

At a point in time when the R terminal of the unit circuit 11 of the k-th stage receives the output signal SROUT(k+1) at the high level (VDD), the transistor Tr2 has been turned on by the Q signal (high level). As such, when the R terminal of the unit circuit 11 of the k-th stage receives the output signal SROUT(k+1) at the high level (VDD), an electric potential at the QB terminal is turned from a low level to a high level via the transistor Tr2. At the same time, the transistor Tr4 is turned on, so that the Q signal is turned from a high level to a low level. When the Q signal is turned to the low level and the QB signal is turned to the high level, the node n1 is turned to a low level (VSS), the transistor Tr7 is turned off, and the transistor Tr8 is tuned on. Accordingly, the output signal SROUTk is turned from the high level (VDD) to a low level (VSS).

Here, the gate terminal of each of the transistors Tr1 and Tr2 receives a Q signal (low level), so that the transistor Tr2 is turned off and the transistor Tr1 is turned on. This causes the power supply voltage Vdd to be supplied to the gate terminal of each of the transistors Tr3 and Tr4. Accordingly, the output (Q signal) of the flip-flop circuit 12a is maintained at a low level. As such, even in a case where the output signal SROUT (k+1) is later turned to a low level (inactive), the output signal SROUTk is maintained at the low level (VSS).

In a frame F2, the S terminal of the unit circuit 11 of the k-th stage receives an output signal SROUT(k−1) (high level (active)) from the unit circuit 11 of the (k−1)-th stage. In response to this, the operations described above (the setting operation and the resetting operation) are carried out. In this manner, the output signals SROUT1 through SROUTn are sequentially supplied to the respective scanning signal lines GL1 through GLn.

(Initialization Operation)

Note, here, that the initialization signal INITB is a signal which is at a high level (VDD) during a time period of normal operation and is at a low level (VSS) during a time period of initialization. In the time period of the initialization, the gate terminal of the transistor Tr5 of the unit circuit 11 of each of the stages receives a low level signal. This causes the transistor Tr5 to be turned on, so that the power supply voltage Vdd is supplied to the gate terminal of the transistor Tr4. Accordingly, the Q signal is turned to VSS (low level), the QB signal is turned to VDD (high level), the transistor Tr7 is turned off, and the transistor Tr8 is turned on. This causes the output signals SROUT1 through SROUTn of the unit circuits 11 of all of the stages in the shift register 10 to be maintained at a low level.

The liquid crystal display device 1 includes the flip-flop circuit 12a as described above, and thus makes it possible to both (i) reduce a circuit area and (ii) carry out an operation in which a reduction in electric potential of an output signal of the scanning signal line drive circuit 100 is prevented.

Note that a flip-flop circuit included in a unit circuit 11 is not limited to the flip-flop circuit 12a, and can be any of the flip-flop circuits described in Embodiments 1 through 6.

Further, a shift register to which the flip-flop circuit of the present embodiment can be applied is not limited to the shift register 10. The flip-flop circuit of the present embodiment can be applied to a known shift register. Each of the flip-flop circuits described above can be applied to various display drive circuits which constitute a liquid crystal display device.

A flip-flop in accordance with an embodiment of the present invention can be arranged such that the regulator circuit reduces a driving capability of a transistor, out of the first through fourth transistors, which is connected to the power supply.

A flip-flop in accordance with an embodiment of the present invention can be arranged such that the regulator circuit is constituted by a resistor.

A flip-flop in accordance with an embodiment of the present invention can be arranged such that, in a case where a connection point between (i) a transistor, out of the first through fourth transistors, which is connected to the power supply, (ii) another transistor, out of the first through fourth transistors, which has a drain terminal thereof connected to a drain terminal of the transistor connected to the power supply, and (iii) the first or second output terminal which is connected to the drain terminal of each of (a) the transistor connected to the power supply and (b) the another transistor is referred to as a first connection point, the resistor is located between the power supply and the first connection point.

A flip-flop in accordance with an embodiment of the present invention can be arranged such that the regulator circuit is constituted by any one of the first through fourth transistors; and a channel length of the one of the first through fourth transistors which serves as the regulator circuit is set longer than that of the input transistor.

A flip-flop in accordance with an embodiment of the present invention can be arranged such that the input transistor is a P channel transistor; and the second input terminal receives a signal that (i) has a first electric potential during a time period in which the signal is inactive and (ii) has a second electric potential which is lower than the first electric potential, during a time period in which the signal is active.

A flip-flop in accordance with an embodiment of the present invention can be arranged such that the input transistor is an N channel transistor; and the second input terminal receives a signal that (i) has a first electric potential during a time period in which the signal is active and (ii) has a second electric potential which is lower than the first electric potential, during a time period in which the signal is inactive.

A flip-flop in accordance with an embodiment of the present invention can be arranged such that the input transistor is a P channel transistor; and the power supply connected to the second input terminal is a high potential power supply.

A flip-flop in accordance with an embodiment of the present invention can be arranged such that the input transistor is an N channel transistor; and the power supply connected to the second input terminal is a low potential power supply.

A flip-flop in accordance with an embodiment of the present invention can be arranged such that the first input terminal receives a set signal; and the second input terminal receives a reset signal.

A flip-flop in accordance with an embodiment of the present invention can be arranged such that the first input terminal receives a reset signal; and the second input terminal receives a set signal.

A flip-flop in accordance with an embodiment of the present invention can further include a third input terminal receiving an initialization signal, the third input terminal being connected to a source terminal of any one of the first through fourth transistors.

A shift register in accordance with an embodiment of the present invention includes any of the flip-flops described above, the flip-flop being provided in a stage of the shift register, the stage outputting an output signal of the stage in accordance with an output signal of the flip-flop.

A display panel in accordance with an embodiment of the present invention includes the shift register and a pixel circuit, the shift register and the pixel circuit being formed monolithically.

A display device in accordance with an embodiment of the present invention includes the shift register.

The present invention is not limited to the above-described embodiments but allows various modifications within the scope of the claims. Any embodiment derived from an appropriate combination of the technical means disclosed in the different embodiments will also be included in the technical scope of the present invention.

INDUSTRIAL APPLICABILITY

The present invention is suitable for drive circuits of a display device.

REFERENCE SIGNS LIST

1 liquid crystal display device (display device)
10 shift register
11 unit circuit of shift register
11a flip-flop circuit (flip-flop)
41 scanning signal line (gate line)
42 common electrode wiring (common line)
43 data signal line (source line)
44 TFT
45 pixel electrode
100 scanning signal line drive circuit (gate driver)
300 data signal line drive circuit (source driver)
400 display panel Tr1 and Tr12 transistor (first transistor)
Tr2 and Tr13 transistor (second transistor)
Tr3 and Tr14 transistor (third transistor)
Tr4 and Tr15 transistor (fourth transistor)
Tr5, Tr6, Tr17, and Tr19 set transistor (input transistor)
Tr20 and Tr21 reset transistor (input transistor)
Q terminal (first output terminal)
QB terminal (second output terminal)
ST set transistor (input transistor)
RT reset set transistor (input transistor)
LC latch circuit
RC latch regulator circuit (regulator circuit)
S and SB set terminal (first input terminal)
R and RB reset terminal (second input terminal)
INIT initialization terminal (third input terminal)

The invention claimed is:

1. A flip-flop comprising:
a first CMOS circuit;
a second CMOS circuit;
a plurality of input terminals;
a first output terminal;
a second output terminal;
an input transistor;
a power supply; and
a regulator circuit,
wherein the first CMOS circuit includes a first transistor which is a P channel transistor and a second transistor which is an N channel transistor, the first transistor having a gate terminal and a drain terminal thereof connected to a gate terminal and a drain of the second transistor, respectively,
the second CMOS circuit includes a third transistor which is a P channel transistor and a fourth transistor which is an N channel transistor, the third transistor having a gate terminal and a drain terminal thereof connected to a gate terminal and a drain terminal of the fourth transistor, respectively,
a gate side of the first CMOS circuit, a drain side of the second CMOS circuit, and the first output terminal are connected to each other,
a drain side of the first CMOS circuit, a gate side of the second CMOS circuit, and the second output terminal are connected to each other,
the input transistor has a gate terminal, a source terminal, and a drain terminal thereof connected to (i) a first input terminal, (ii) a second input terminal, and (iii) each of the first CMOS circuit and the second CMOS circuit, respectively,
the power supply (i) is connected to the first CMOS circuit or the second CMOS circuit and (ii), when a first input signal supplied to the first input terminal is turned to be active, is electrically connected to the second input terminal,
the regulator circuit regulates an electric potential between the second input terminal and the power supply when the second input terminal and the power supply are electrically connected to each other.

2. The flip-flop as set forth in claim 1, wherein:
the regulator circuit reduces a driving capability of a transistor, out of the first through fourth transistors, which is connected to the power supply.

3. The flip-flop as set forth in claim 1, wherein:
the regulator circuit is constituted by a resistor.

4. The flip-flop as set forth in claim 3, wherein:
in a case where a connection point between (i) a transistor, out of the first through fourth transistors, which is connected to the power supply, (ii) another transistor, out of the first through fourth transistors, which has a drain terminal thereof connected to a drain terminal of the transistor connected to the power supply, and (iii) the first or second output terminal which is connected to the drain terminal of each of (a) the transistor connected to the power supply and (b) the another transistor is referred to as a first connection point, the resistor is located between the power supply and the first connection point.

5. The flip-flop as set forth in claim 1, wherein:
the regulator circuit is constituted by any one of the first through fourth transistors; and
a channel length of the one of the first through fourth transistors which serves as the regulator circuit is set longer than that of the input transistor.

6. The flip-flop as set forth in claim 1, wherein:
the input transistor is a P channel transistor; and
the second input terminal receives a signal that (i) has a first electric potential during a time period in which the signal is inactive and (ii) has a second electric potential which is lower than the first electric potential, during a time period in which the signal is active.

7. The flip-flop as set forth in claim 1, wherein:
the input transistor is an N channel transistor; and
the second input terminal receives a signal that (i) has a first electric potential during a time period in which the signal is active and (ii) has a second electric potential which is lower than the first electric potential, during a time period in which the signal is inactive.

8. The flip-flop as set forth in claim 1, wherein:
the input transistor is a P channel transistor; and
the power supply connected to the second input terminal is a high potential power supply.

9. The flip-flop as set forth in claim 1, wherein:
the input transistor is an N channel transistor; and
the power supply connected to the second input terminal is a low potential power supply.

10. The flip-flop as set forth in claim 1, wherein:
the first input terminal receives a set signal; and
the second input terminal receives a reset signal.

11. The flip-flop as set forth in claim 1, wherein:
the first input terminal receives a reset signal; and
the second input terminal receives a set signal.

12. A flip-flop as set forth in claim 1, further comprising a third input terminal receiving an initialization signal,
the third input terminal being connected to a source terminal of any one of the first through fourth transistors.

13. A shift register comprising a flip-flop recited in claim 1, the flip-flop being provided in a stage of the shift register,
the stage outputting an output signal of the stage in accordance with an output signal of the flip-flop.

14. A display panel comprising:
a shift register recited in claim 13; and
a pixel circuit,
the shift register and the pixel circuit being formed monolithically.

15. A display device comprising a shift register recited in claim 13.

* * * * *